(12) United States Patent
Shimizu et al.

(10) Patent No.: US 11,114,531 B2
(45) Date of Patent: Sep. 7, 2021

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Masayasu Miyata, Kawasaki (JP); Hirotaka Nishino, Yokohama (JP); Yoshihiko Moriyama, Setagaya (JP); Yuichiro Mitani, Hayama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 85 days.

(21) Appl. No.: 15/891,984

(22) Filed: Feb. 8, 2018

(65) Prior Publication Data

US 2018/0308936 A1    Oct. 25, 2018

(30) Foreign Application Priority Data

Apr. 24, 2017 (JP) .............................. JP2017-085421

(51) Int. Cl.
*H01L 29/16* (2006.01)
*H01L 29/66* (2006.01)
(Continued)

(52) U.S. Cl.
CPC ........ *H01L 29/1608* (2013.01); *H01L 21/046* (2013.01); *H01L 21/0485* (2013.01);
(Continued)

(58) Field of Classification Search
CPC ............ H01L 29/1095; H01L 29/1608; H01L 29/66068; H01L 29/7395; H01L 29/7802; H01L 21/324; H01L 21/046
See application file for complete search history.

(56) References Cited

U.S. PATENT DOCUMENTS 4,161,743 A * 7/1979 Yonezawa ............. H01L 21/314
257/636
8,624,264 B2    1/2014 Shimizu et al.
(Continued)

FOREIGN PATENT DOCUMENTS

JP        2012-186324       9/2012
JP        5418466           2/2014
(Continued)

*Primary Examiner* — Kenneth Parker
*Assistant Examiner* — Long H Le
(74) *Attorney, Agent, or Firm* — Oblon, McClelland, Maier & Neustadt, L.L.P.

(57) ABSTRACT

A semiconductor device according to an embodiment includes a first electrode; a second electrode; a gate electrode; an n-type first silicon carbide region positioned between the first electrode and the second electrode and between the gate electrode and the second electrode; a p-type second silicon carbide region positioned between the first electrode and the first silicon carbide region; a third silicon carbide region of metal containing at least one element selected from the group consisting of nickel (Ni), palladium (Pd), and platinum (Pt), positioned between the first electrode and the second silicon carbide region and spaced apart from the first silicon carbide region; and a gate insulating layer positioned between the gate electrode and the second silicon carbide region.

13 Claims, 24 Drawing Sheets

(51) Int. Cl.

| | | |
|---|---|---|
| *H01L 29/78* | (2006.01) | |
| *H01L 29/10* | (2006.01) | |
| *H01L 29/739* | (2006.01) | |
| *H01L 21/04* | (2006.01) | |
| *H01L 21/324* | (2006.01) | |
| *H01L 29/45* | (2006.01) | |
| *H01L 29/417* | (2006.01) | |
| *H01L 29/08* | (2006.01) | |

(52) U.S. Cl.
  CPC ........ *H01L 21/324* (2013.01); *H01L 29/0865* (2013.01); *H01L 29/0882* (2013.01); *H01L 29/41766* (2013.01); *H01L 29/45* (2013.01); *H01L 29/66068* (2013.01); *H01L 29/7395* (2013.01); *H01L 29/7397* (2013.01); *H01L 29/7802* (2013.01); *H01L 29/7813* (2013.01); *H01L 29/1095* (2013.01)

(56) References Cited

U.S. PATENT DOCUMENTS

| | | |
|---|---|---|
| 8,823,017 B2 | 9/2014 | Tamaso |
| 9,490,327 B2 | 11/2016 | Shimizu et al. |
| 2011/0193101 A1* | 8/2011 | Yanase .................. H01L 21/046 257/77 |
| 2012/0146055 A1* | 6/2012 | Mitani ................ H01L 29/0619 257/77 |
| 2012/0228630 A1 | 9/2012 | Shimizu et al. |
| 2014/0183561 A1 | 7/2014 | Shimizu |
| 2015/0236098 A1* | 8/2015 | Shimizu ............... H01L 29/1608 257/77 |
| 2015/0236099 A1* | 8/2015 | Shimizu ............... H01L 29/1608 257/77 |
| 2016/0155640 A1* | 6/2016 | Nakajima ........... H01L 21/0485 438/602 |
| 2016/0284833 A1 | 9/2016 | Shimizu et al. |
| 2017/0077087 A1* | 3/2017 | Horikawa ............... H01L 29/78 |
| 2017/0140934 A1 | 5/2017 | Hamada et al. |

FOREIGN PATENT DOCUMENTS

| | | |
|---|---|---|
| JP | 2014-127709 A | 7/2014 |
| JP | 2015-153950 A | 8/2015 |
| JP | 2015-153959 | 8/2015 |
| JP | 2016-181671 A | 10/2016 |
| WO | WO 2012/060222 A1 | 5/2012 |
| WO | 2016-017215 A1 | 2/2016 |

* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-085421, filed on Apr. 24, 2017, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) has been expected as a material for next generation semiconductor devices. As compared with silicon (Si), SiC has superior physical properties that a band gap is three times of that of Si, a breakdown field strength is about ten times of that of Si, and a thermal conductivity is about three times of that of Si. These characteristics are utilized to achieve a semiconductor device capable of operating with a low loss at high temperature.

There is a request for further reduction in on-resistance in order to further reduce a loss of a SiC device having a MOS structure, such as a metal oxide semiconductor (MOSFET) and an insulated gate bipolar transistor (IGBT).

DETAILED DESCRIPTION

Figure 1:
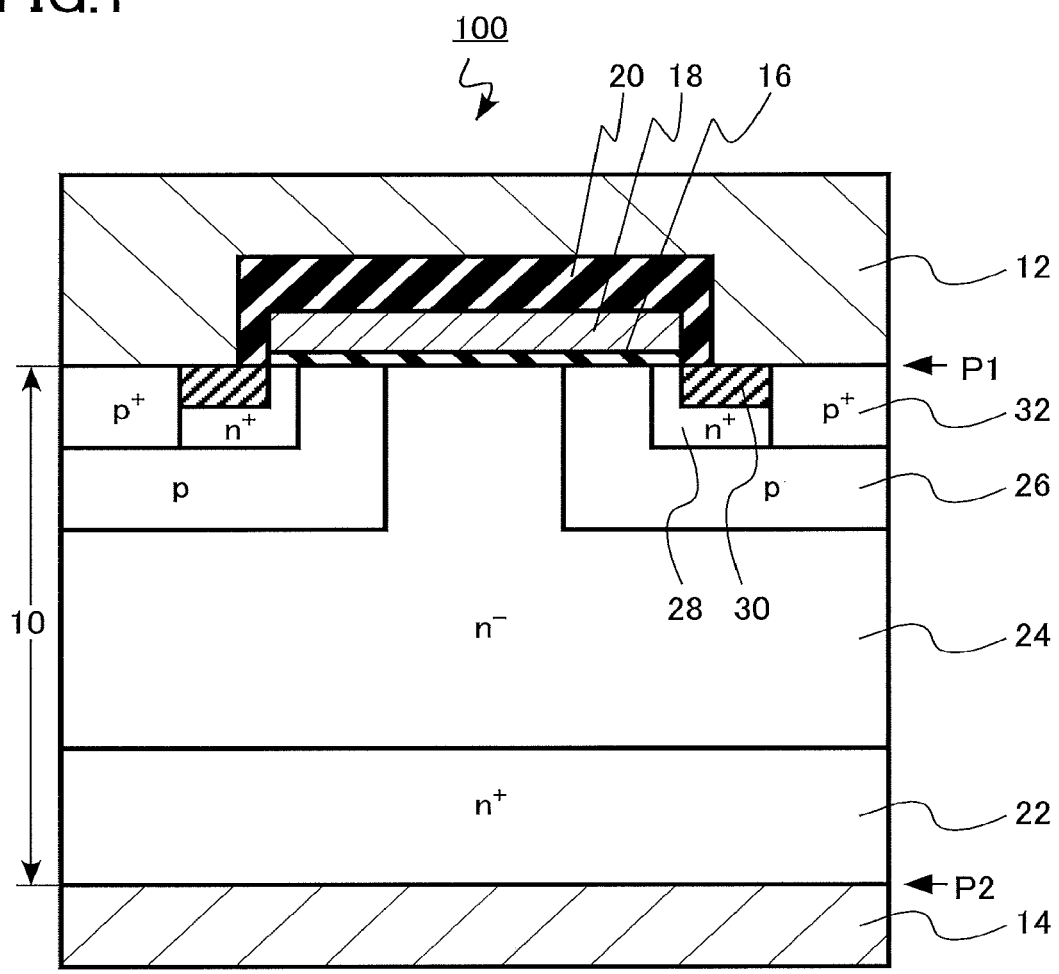
FIG. 1 is a schematic cross-sectional view of a semiconductor device of a first embodiment.

A semiconductor device according to an embodiment includes: a first electrode; a second electrode; a gate electrode; an n-type first silicon carbide region positioned between the first electrode and the second electrode and between the gate electrode and the second electrode; a p-type second silicon carbide region positioned between the first electrode and the first silicon carbide region; a third silicon carbide region of metal containing at least one element selected from the group consisting of nickel (Ni), palladium (Pd), and platinum (Pt), positioned between the first electrode and the second silicon carbide region and spaced apart from the first silicon carbide region; and a gate insulating layer positioned between the gate electrode and the second silicon carbide region.

Hereinafter, embodiments of the present disclosure will be described with reference to the drawings. In the following description, the same members and the like will be denoted by the same reference numerals, and members that have been once described will not be described as appropriate.

In the following description, notations $n^+$, n, $n_-$, $p^+$, p, and $p^-$ indicate relative levels of impurity concentration in each conductivity type. That is, $n^+$ indicates an n-type impurity concentration higher than that of n, and $n^-$ indicates an n-type impurity concentration lower than that of n. In addition, p⁺ indicates a p-type impurity concentration higher than that of p, and p⁻ indicates a p-type impurity concentration lower than that of p. In some cases, an n⁺-type and an n⁻-type are simply referred to as an n-type, and a p⁺-type and a p⁻-type are simply referred to as a p-type.

First Embodiment

A semiconductor device according to this embodiment includes: a first electrode; a second electrode; a gate electrode; an n-type first silicon carbide region positioned between the first electrode and the second electrode and between the gate electrode and the second electrode; a p-type second silicon carbide region positioned between the first electrode and the first silicon carbide region; a third silicon carbide region of metal containing at least one element selected from the group consisting of nickel (Ni), palladium (Pd), and platinum (Pt), positioned between the first electrode and the second silicon carbide region and spaced apart from the first silicon carbide region; and a gate insulating layer positioned between the gate electrode and the second silicon carbide region.

The semiconductor device further includes a p-type fourth silicon carbide region positioned between the second silicon carbide region and the first electrode and having a p-type impurity concentration higher than that of the second silicon carbide region. In addition, an n-type fifth silicon carbide region is provided between the second silicon carbide region and the third silicon carbide region.

FIG. 1 is a schematic cross-sectional view of the semiconductor device of this embodiment. This semiconductor device is a planar gate vertical MOSFET using silicon carbide. A MOSFET 100 is, for example, a double implantation MOSFET (DIMOSFET) in which a p-well and a source region are formed by ion implantation.

The MOSFET 100 includes a silicon carbide layer 10, a source electrode 12 (first electrode), a drain electrode 14 (second electrode), a gate insulating layer 16, a gate electrode 18, and an interlayer insulating layer 20.

An n⁺-type drain region 22 (seventh silicon carbide region), an n⁻-type drift region 24 (first silicon carbide region), a p-type body region 26 (second silicon carbide region), an n⁺-type semiconductor source region 28 (fifth silicon carbide region), a metal source region 30 (third silicon carbide region) made of metal, and a p⁺-type body contact region 32 (fourth silicon carbide region) are provided inside the silicon carbide layer 10.

At least a part of the silicon carbide layer 10 is provided between the source electrode 12 and the drain electrode 14. At least a part of the silicon carbide layer 10 is provided between the gate electrode 18 and the drain electrode 14. The silicon carbide layer 10 is a single crystal SiC. The silicon carbide layer 10 is, for example, a 4H—SiC.

The silicon carbide layer 10 has a first face ("P1" in FIG. 1) and a second face ("P2" in FIG. 1). Hereinafter, the first face is also referred to as a front surface, and the second face is referred to as a back surface. Hereinafter, a "depth" means a depth set with the first face as a reference.

The first face is, for example, a face inclined by 0° to 8° with respect to a (0001) face. In addition, the second face is, for example, a face inclined by 0° to 8° with respect to a (000-1) face. The (0001) face is referred to as a silicon face. The (000-1) face is referred to as a carbon face.

The n⁺-type drain region 22 is provided on the back side of the silicon carbide layer 10. The drain region 22 contains, for example, nitrogen (N) as n-type impurities. An n-type impurity concentration of the drain region 22 is, for example, $1\times10^{10}$ cm⁻³ to $1\times10^{21}$ cm⁻³.

The n⁻-type drift region 24 is provided on the drain region 22. The drift region 24 contains, for example, nitrogen (N) as n-type impurities. An n-type impurity concentration of the drift region 24 is lower than the n-type impurity concentration of the drain region 22. The n-type impurity concentration of the drift region 24 is, for example, $4\times10^{14}$ cm⁻³ to $1\times10^{17}$ cm⁻³. A thickness of the drift region 24 is, for example, 5 μm to 150 μm.

The body region 26 is provided between the source electrode 12 and the drift region 24. A contact face between the body region 26 and the gate insulating layer 16 functions as a channel region of the MOSFET 100.

The body region 26 contains, for example, aluminum (Al) as p-type impurities. A p-type impurity concentration of the body region 26 is, for example, $1\times10^{17}$ cm⁻³ to $1\times10^{19}$ cm⁻³.

A depth of the body region is, for example, 0.3 μm to 0.8 μm.

The semiconductor source region 28 is provided between the source electrode 12 and the body region 26. The semiconductor source region 28 is spaced apart from the drift region 24.

The semiconductor source region 28 contains, for example, phosphorus (P) as n-type impurities. An n-type impurity concentration of the semiconductor source region 28 is higher than the n-type impurity concentration of the drift region 24.

The n-type impurity concentration of the semiconductor source region 28 is, for example, $1\times10^{19}$ cm⁻³ to $1\times10^{21}$ cm⁻³. A depth of the semiconductor source region 28 is shallower than the depth of the body region 26 and is, for example, 0.1 μm to 0.3 μm.

The semiconductor source region 28 is fixed, for example, to a potential of the source electrode 12.

The metal source region 30 is provided between the source electrode 12 and the body region 26. The metal source region 30 is provided between the source electrode 12 and the semiconductor source region 28. The metal source region 30 is spaced apart from the drift region 24.

The metal source region 30 is metal. The metal source region 30 is metallized silicon carbide.

The metal source region 30 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide. Alternatively, the metal impurities are in carbon defects of silicon carbide.

An atomic concentration of the metal impurities in the metal source region 30 is, for example, $1\times10^{19}$ cm⁻³ to $5\times10^{22}$ cm⁻³.

A depth of the metal source region 30 is shallower than that of the semiconductor source region 28, for example. The depth of the metal source region 30 is, for example, 0.01 μm to 0.3 μm. A thickness of the metal source region 30 in a direction toward the drain electrode 14 from the source electrode 12 is, for example, 0.01 μm to 0.3 μm.

A sheet resistance of the metal source region 30 is, for example, 0.5Ω/□ or less. A work function of the metal source region 30 is, for example, 3.7 eV or less The metal source region 30 is fixed, for example, to the potential of the source electrode 12.

The p⁺-type body contact region 32 is provided between the source electrode 12 and the body region 26. A p-type impurity concentration of the body contact region 32 is higher than the p-type impurity concentration in the body region 26.

The body contact region 32 contains, for example, aluminum (Al) as p-type impurities. The p-type impurity concentration in the body contact region 32 is, for example, $1 \times 10^{19}$ cm$^{-3}$ to $1 \times 10^{21}$ cm$^{-3}$.

A depth of the body contact region 32 is, for example, 0.3 μm to 0.6 μm.

The body contact region 32 is fixed, for example, to the potential of the source electrode 12.

The gate electrode 18 is a conductive layer. The gate electrode 18 is, for example, polycrystalline silicon containing p-type impurities or n-type impurities.

The gate insulating layer 16 is provided between the gate electrode 18 and the body region 26. In addition, the gate insulating layer 16 is provided between the gate electrode 18 and the drift region 24. The gate insulating layer 16 is in contact with the body region 26, for example.

The gate insulating layer 16 is, for example, silicon oxide. For example, a high-k insulating material (high dielectric constant insulating material) can be applied as the gate insulating layer 16.

The interlayer insulating layer 20 is provided on the gate electrode 18. The interlayer insulating layer 20 is, for example, silicon oxide.

The source electrode 12 is in contact with the metal source region 30. In addition, the source electrode 12 is in contact with the body contact region 32.

The source electrode 12 contains metal. The source electrode 12 contains, for example, titanium (Ti) and aluminum (Al). The metal forming the source electrode 12 is, for example, an alloy of titanium (Ti) and aluminum (Al).

The drain electrode 14 is provided on the back surface of the silicon carbide layer 10. The drain electrode 14 is in contact with the drain region 22.

The drain electrode 14 is, for example, metal or a metal semiconductor compound. The drain electrode 14 includes, for example, a material selected from the group consisting of nickel silicide, titanium (Ti), nickel (Ni), silver (Ag), and gold (Au).

Although N (nitrogen) or P (phosphorus), for example, is preferable as the n-type impurity in this embodiment, but As (arsenic), Sb (antimony), or the like can also be applied. In addition, Al (aluminum) is preferable as the p-type impurity, but B (boron), Ga (gallium), In (indium), or the like can also be applied.

An impurity type and an impurity concentration of the semiconductor body region can be measured by, for example, secondary ion mass spectrometry (SIMS) and energy dispersive X-ray spectroscopy (EDX). In addition, a relative level of the impurity concentration can also be determined based on a level of a carrier concentration obtained by, for example, scanning capacitance microscopy (SCM). In addition, a distance such as a depth and a thickness of an impurity region can be obtained by SIMS, for example. In addition, a distance such as a depth, a thickness, a width, and an interval of an impurity region can be obtained from a combined image of an SCM image and an atomic force microscope (AFM) image, for example. In addition, whether a silicon carbide region is a semiconductor or metal can be determined by SCM, for example. In addition, whether a silicon carbide region is a semiconductor or metal can be determined, for example, by measuring a temperature dependence of a resistance of the silicon carbide region. Whether the above element is present at a silicon site or a carbon site of a crystal structure of silicon carbide can be determined by X-ray photoelectron spectroscopy (XPS), for example.

Next, a method for manufacturing the semiconductor device of this embodiment will be described.

In the method for manufacturing the semiconductor device of this embodiment includes performing ion implantation of a p-type impurity into a silicon carbide layer including an n-type first silicon carbide region to form a p-type second silicon carbide region; performing ion implantation of at least one element selected from the group consisting of nickel (Ni), palladium (Pd), and platinum (Pt) into a portion of the silicon carbide layer; performing heat treatment after the ion implantation of the at least one element and metallizing the portion to form a third silicon carbide region of metal; forming a gate insulating layer on the p-type second silicon carbide region; forming a gate electrode on the gate insulating layer; forming a first electrode on the third silicon carbide region; and forming a second electrode with the silicon carbide layer interposed between the first and second electrodes.

Further, performing ion implantation of silicon (Si) into the portion before the heat treatment is included in the method for manufacturing the semiconductor device of this embodiment. In addition, performing ion implantation of a p-type impurity to form a p-type fourth silicon carbide region before the heat treatment is included. In addition, performing ion implantation of an n-type impurity into the silicon carbide layer to form an n-type fifth silicon carbide region before the heat treatment is included.

Figure 2:
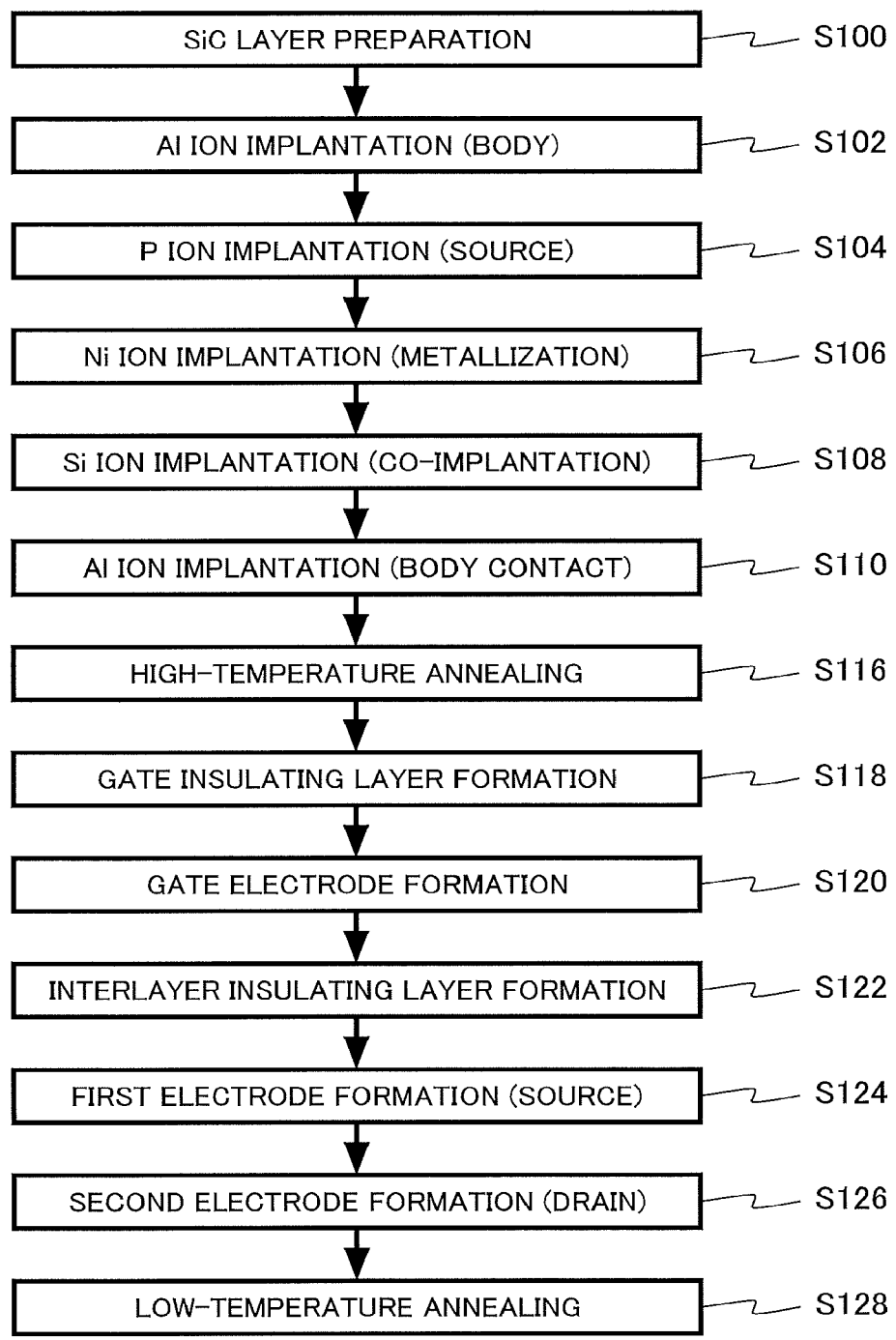
FIG. 2 is a flowchart of a process exemplifying a method for manufacturing the semiconductor device of the first embodiment.

FIG. 2 is a flowchart of a process exemplifying the method for manufacturing the semiconductor device of this embodiment. FIGS. 3 to 9 are schematic cross-sectional views illustrating the semiconductor device in the middle of being manufactured in the method for manufacturing the semiconductor device of this embodiment.

Hereinafter, a case where the at least one element is nickel (Ni) will be described as an example.

As illustrated in FIG. 2, the method for manufacturing the semiconductor device includes: silicon carbide layer (SiC layer) preparation (step S100); ion implantation of Al (step S102); ion implantation of P (step S104); ion implantation of Ni (step S106); ion implantation of Si (step S108); ion implantation of Al (step S110); high-temperature annealing (step S116); gate insulating layer formation (step S118); gate electrode formation (step S120); interlayer insulating layer formation (step S122); first electrode formation (step S124); second electrode formation (step S126); and low-temperature annealing (step S128).

In step S100, the silicon carbide layer 10 is prepared. The silicon carbide layer 10 includes the n$^+$-type drain region 22 and the n$^-$-type drift region 24 (first silicon carbide region). The drift region 24 is formed, for example, on the n$^+$-type drain region 22 by an epitaxial growth method.

Figure 3:
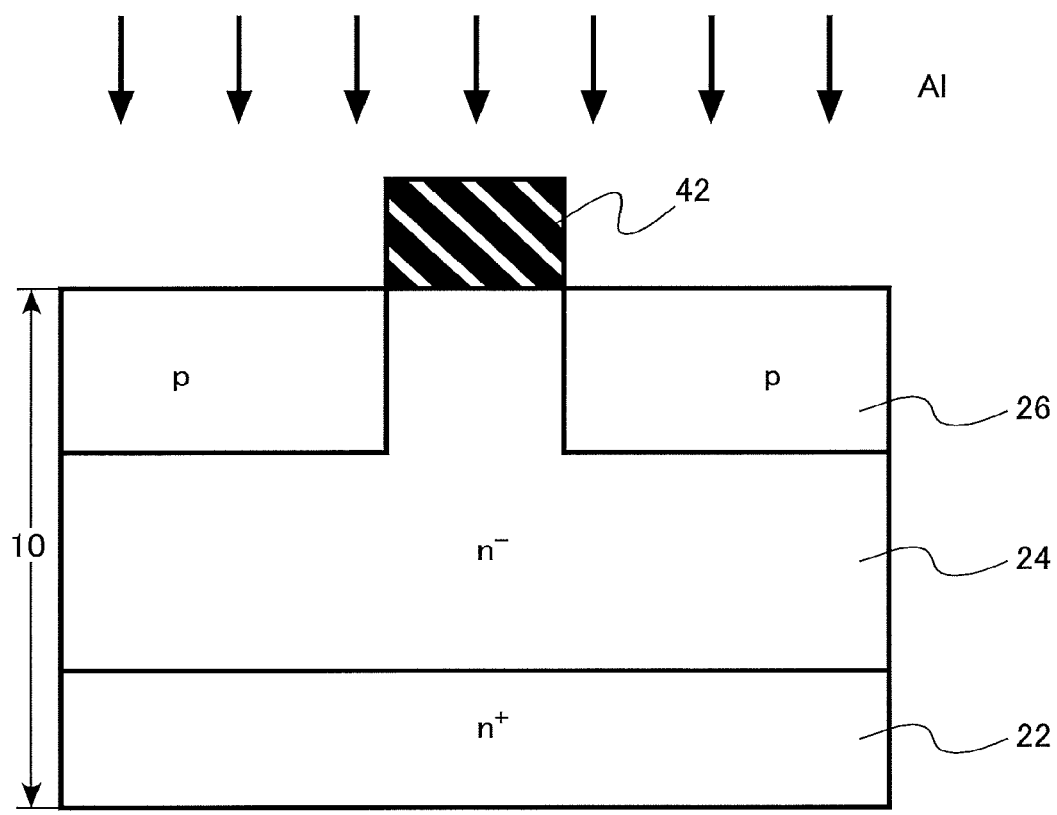
FIG. 3 is a schematic cross-sectional view illustrating the semiconductor device in the middle of being manufactured in the method for manufacturing the semiconductor device of the first embodiment.

Next, a first mask material 42 made of, for example, silicon oxide is formed by patterning using photolithography and etching. In step S102, aluminum (Al) as the p-type impurity is ion-implanted into the drift region 24 using this first mask material 42 as an ion implantation mask, thereby forming the body region 26 (second silicon carbide region) (FIG. 3).

Figure 4:
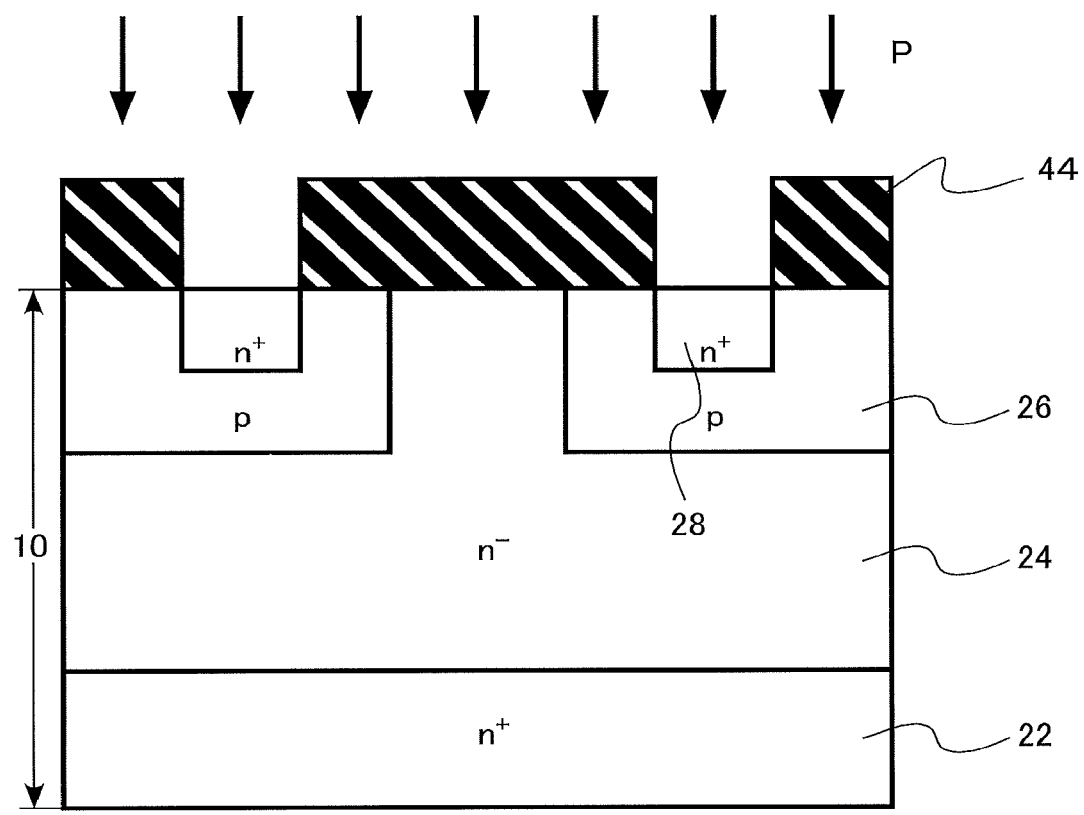
FIG. 4 is a schematic cross-sectional view illustrating the semiconductor device in the middle of being manufactured in the method for manufacturing the semiconductor device of the first embodiment.

Next, a second mask material 44 made of, for example, silicon oxide is formed by patterning using photolithography and etching. In step S104, phosphorus (P) as the n-type impurity is ion-implanted into the body region 26 using this second mask material 44 as an ion implantation mask, thereby forming the semiconductor source region 28 (fifth silicon carbide region) (FIG. 4).

Figure 5:
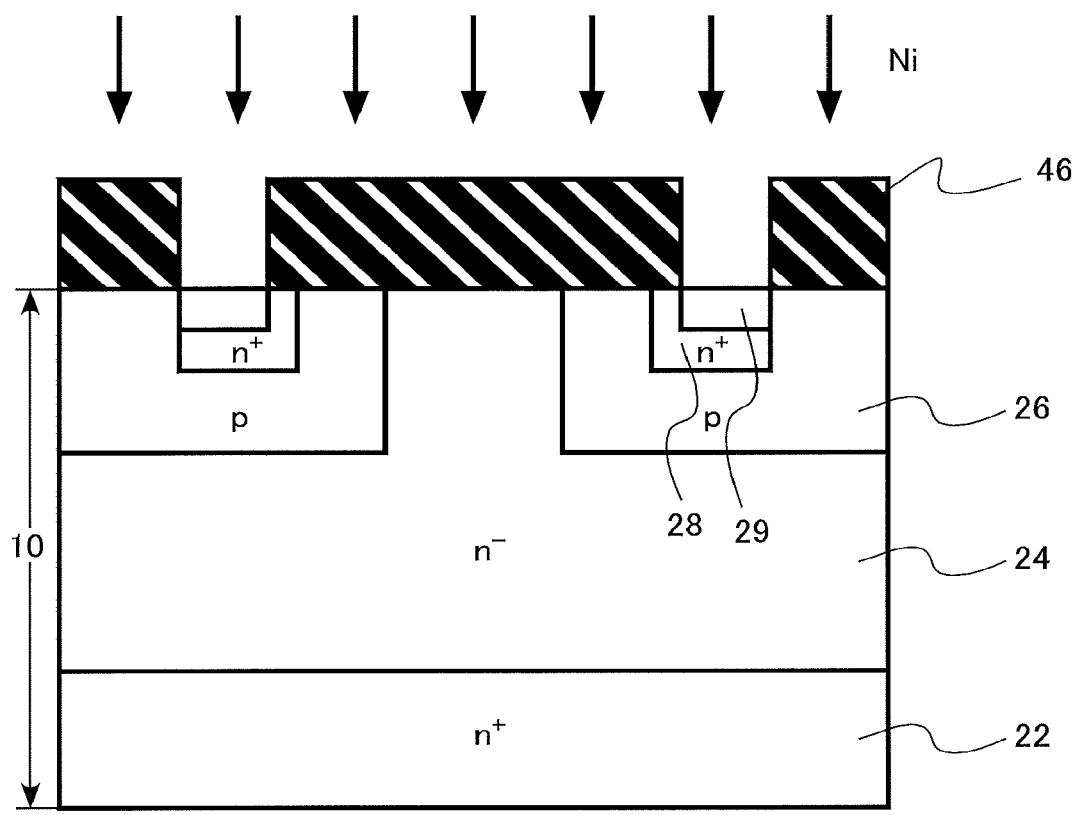
FIG. 5 is a schematic cross-sectional view illustrating the semiconductor device in the middle of being manufactured in the method for manufacturing the semiconductor device of the first embodiment.

Next, a third mask material 46 made of, for example, silicon oxide is formed by patterning using photolithography and etching. In step S106, nickel (Ni) is ion-implanted into the semiconductor source region 28 using this third mask material 46 as an ion implantation mask, thereby forming a metal impurity region 29 (FIG. 5). The nickel may be ion-implanted directly using the second mask material 44.

Figure 6:
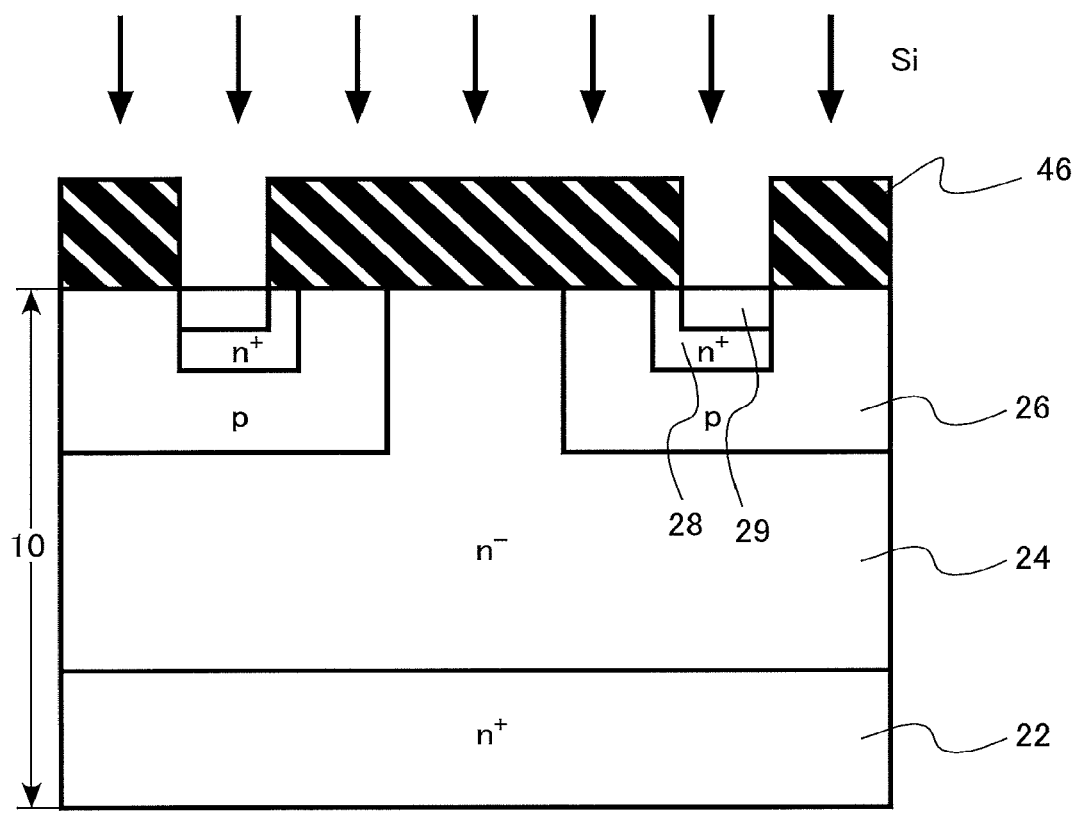
FIG. 6 is a schematic cross-sectional view illustrating the semiconductor device in the middle of being manufactured in the method for manufacturing the semiconductor device of the first embodiment.

Next, in step S108, silicon (Si) is ion-implanted into the metal impurity region 29 using the third mask material 46 as an ion implantation mask (FIG. 6). For example, when the nickel is ion-implanted directly using the second mask material 44, the second mask material 44 is directly used for the silicon as well.

Figure 7:
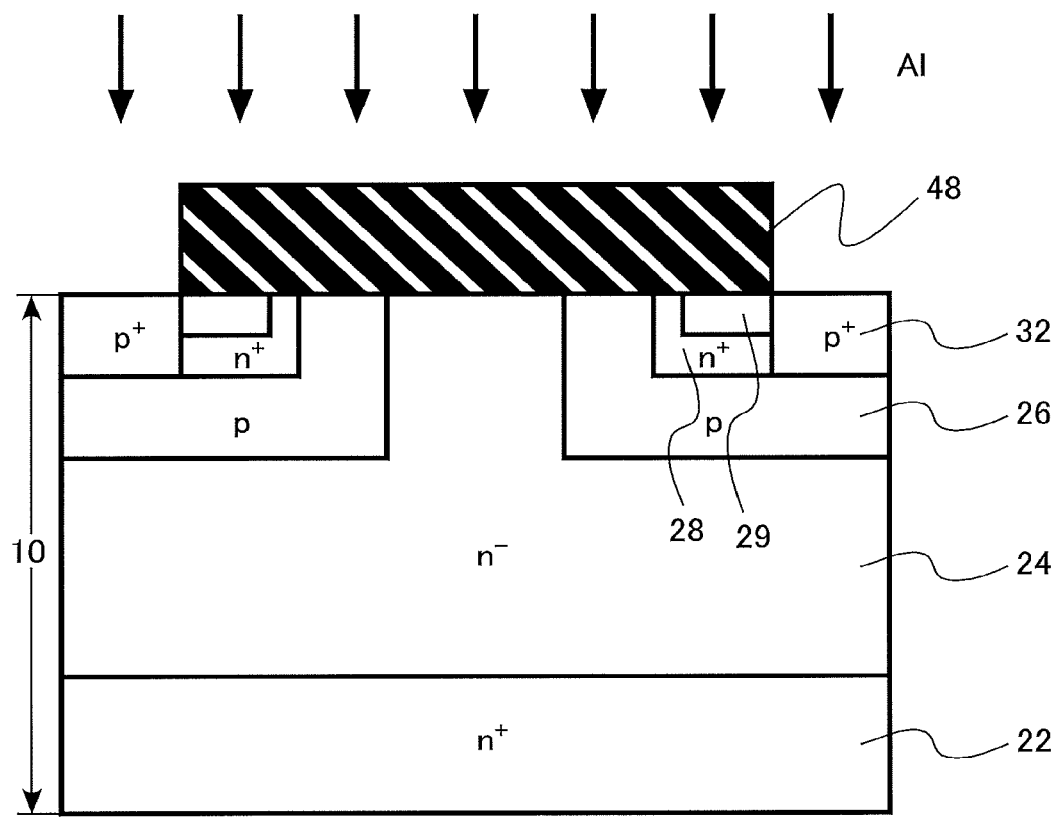
FIG. 7 is a schematic cross-sectional view illustrating the semiconductor device in the middle of being manufactured in the method for manufacturing the semiconductor device of the first embodiment.

Next, a fourth mask material 48 made of, for example, silicon oxide is formed by patterning using photolithography and etching. In step S110, aluminum (Al) as a p-type impurity is ion-implanted into the body region 26 using this fourth mask material 48 as an ion implantation mask, thereby forming the body contact region 32 (fourth silicon carbide region) (FIG. 7).

Figure 8:
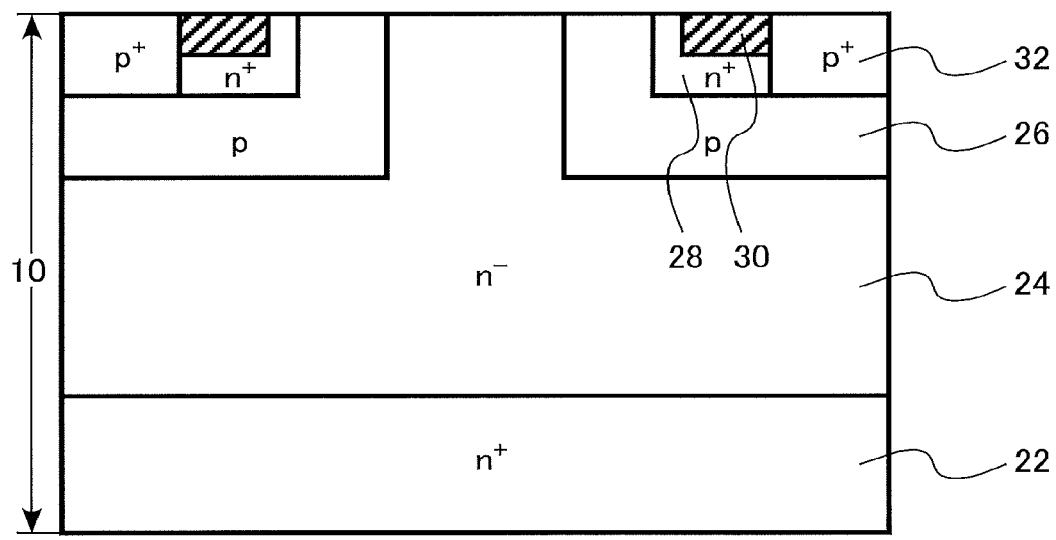
FIG. 8 is a schematic cross-sectional view illustrating the semiconductor device in the middle of being manufactured in the method for manufacturing the semiconductor device of the first embodiment.

Next, in step S116, high-temperature annealing is performed. In the high-temperature annealing, the p-type impurities in the body region 26 and the body contact region 32 and the n-type impurities in the semiconductor source region 28 are activated. Further, the metal impurity region 29 is metallized to form the metal source region 30 (FIG. 8).

The high-temperature annealing is performed under conditions, for example, that heating temperature is 1600° C. to 2000° C. and heating time is 10 minutes to 60 minutes using an inert gas such as argon (Ar) gas as an atmospheric gas.

A heat treatment method for the high-temperature annealing is not particularly limited. Any method such as heater heating, lamp annealing, and laser annealing can be applied. The heater heating and lamp annealing are preferable from the viewpoint of reducing the process cost.

Figure 9:
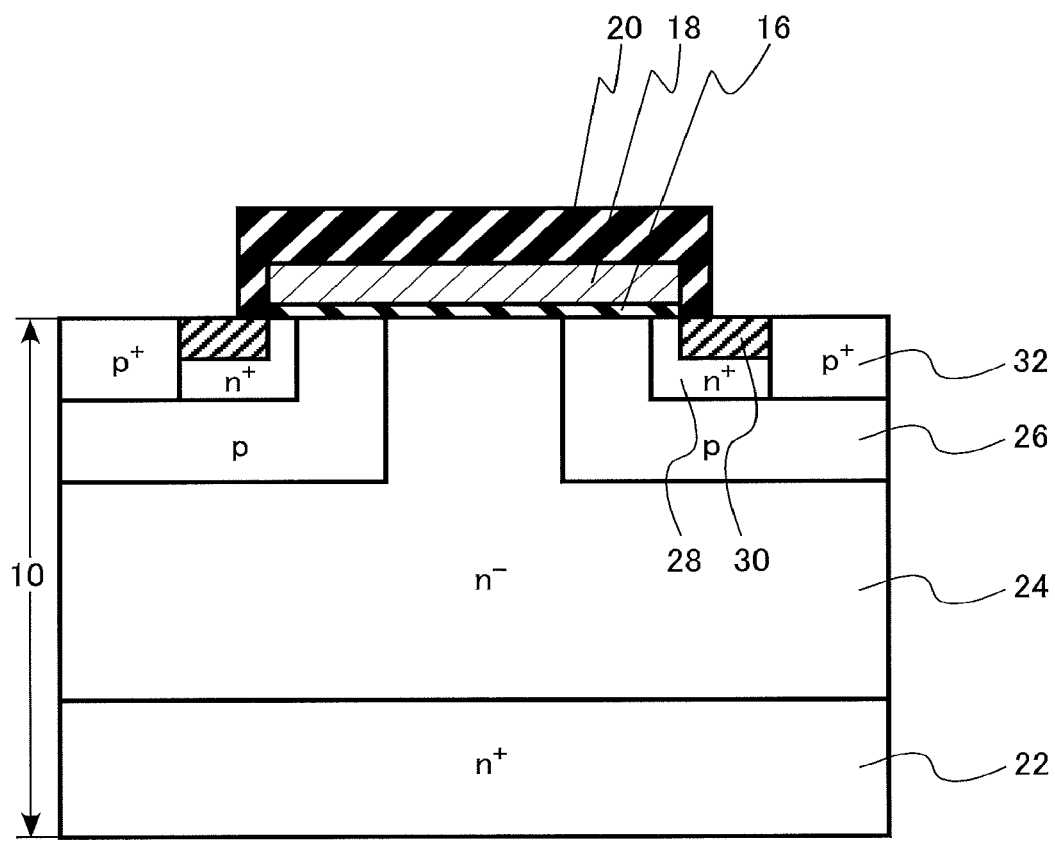
FIG. 9 is a schematic cross-sectional view illustrating the semiconductor device in the middle of being manufactured in the method for manufacturing the semiconductor device of the first embodiment.

In step S118, the gate insulating layer 16, for example, made of a silicon oxide film is formed by a chemical vapor deposition (CVD) method or a thermal oxidation method. Then, in step S120, for example, the gate electrode 18 made of polysilicon is formed on the gate insulating layer 16. In step S122, for example, the interlayer insulating layer 20 made of a silicon oxide film is formed on the gate electrode 18 (FIG. 9).

Then, in step S124, the conductive source electrode 12 is formed on the metal source region 30 and the body contact region 32. The source electrode 12 is electrically connected to the metal source region 30 and the body contact region 32. The source electrode 12 is formed by sputtering of Ti (titanium) and Al (aluminum), for example.

In step S126, the conductive drain electrode 14 is formed on a side of the silicon carbide layer 10 opposite to the source electrode 12. In other words, the drain electrode 14 is formed with the drift region 24 interposed between the drain electrode 14 and the source electrode 12. The drain electrode 14 is formed by, for example, sputtering of nickel (Ni).

In step S128, low-temperature annealing is performed in order to reduce a contact resistance between the source electrode 12 and the drain electrode 14. The low-temperature annealing is performed, for example, in an argon gas atmosphere at 300° C. to 500° C.

The MOSFET 100 illustrated in FIG. 1 is formed according to the above manufacturing method.

Hereinafter, a function and an effect of this embodiment will be described in detail.

There is a request for further reduction in on-resistance in order to realize a low loss of a SiC device. In the MOSFET 100 of this embodiment, it is possible to reduce the on-resistance by metallizing at least a part of the source region and reducing a parasitic resistance.

As a result of studies conducted by the inventors based on first principle calculation, it has been found that SiC is metallized by entering of at least one element (metal impurity) selected from the group consisting of nickel (Ni), palladium (Pd), and platinum (Pt). Hereinafter, a case where the above element (metal impurity) is nickel (Ni) will be described as an example.

Figure 10A:
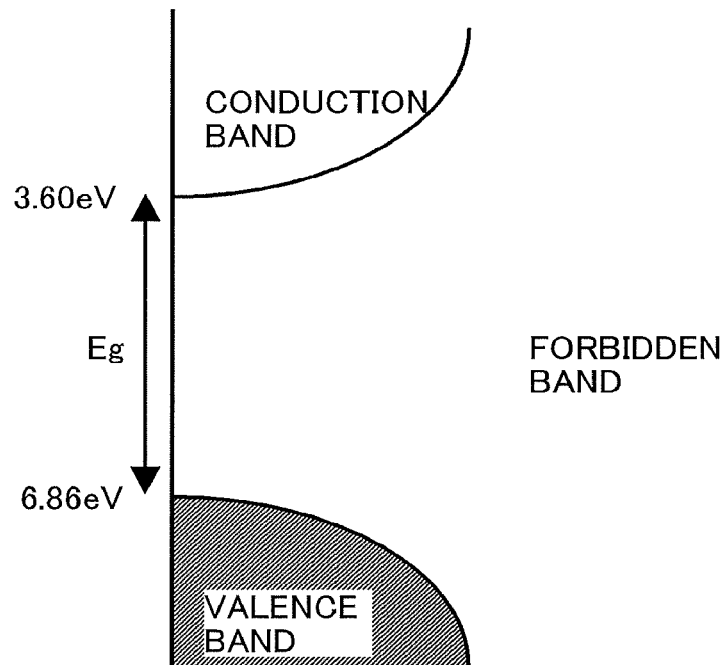
FIGS. 10A and 10B are diagrams illustrating a function of the first embodiment.
Figure 10B:
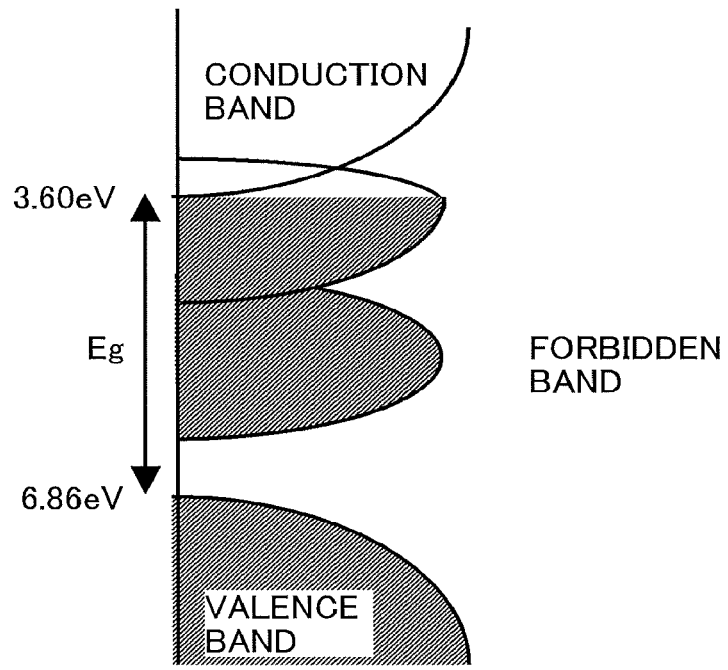

FIGS. 10A and 10B are diagrams illustrating the function of this embodiment. FIG. 10A is a band diagram of silicon carbide (SiC) in the case of containing no metal impurity. FIG. 10B is a band diagram when the metal impurity enters a carbon site of a crystal structure of silicon carbide. Both FIG. 10A and FIG. 10B illustrate an energy level density and an energy level filling state with an electron. The region indicated by hatching in FIGS. 10A and 10B illustrates a state where the energy levels are filled with electrons.

According to the first principle calculation, SiC is metallized as nickel enters a site of carbon, and a work function thereof becomes 3.7 eV or less. This work function is approximately equal to 3.60 eV, which is a potential energy measured from a vacuum level at a conduction band minimum of SiC.

This state is considered to be realized as newly formed energy levels in a forbidden band of SiC are filled with electrons supplied from nickel as illustrated in FIG. 10B. It is considered that the energy level formed in a band gap of SiC is caused due to dangling bond of silicon formed by generation of carbon defects.

The carbon defects are generated, for example, by damage of ion implantation that introduces impurities into SiC. When the carbon defects occur, empty levels appear near the conduction band minimum of SiC in the forbidden band of SiC. It is considered that the empty levels are filled as the electrons are supplied to the empty levels from nickel entering the carbon site, thereby metallizing SiC.

Nickel in SiC is more stable in an equilibrium state in the case of entering the silicon site or interstitial position of crystal lattice than in the case of entering the carbon site. When nickel enters the silicon site or interstitial position, SiC is not metallized.

For example, it is preferable to introduce nickel into SiC by ion implantation and generate a large amount of carbon defects using ion implantation damage in order to metallize SiC by introducing nickel. Nickel is likely to enter the carbon site by generating the carbon defects, which prevents nickel from entering the silicon site.

In addition, for example, it is considered that irradiation of SiC with an electron beam prior to heat treatment is effective in terms of generating a large amount of carbon defects.

It is preferable to introduce silicon together with nickel into SiC from the viewpoint of promoting the metallization of SiC by introducing nickel.

Figure 11:
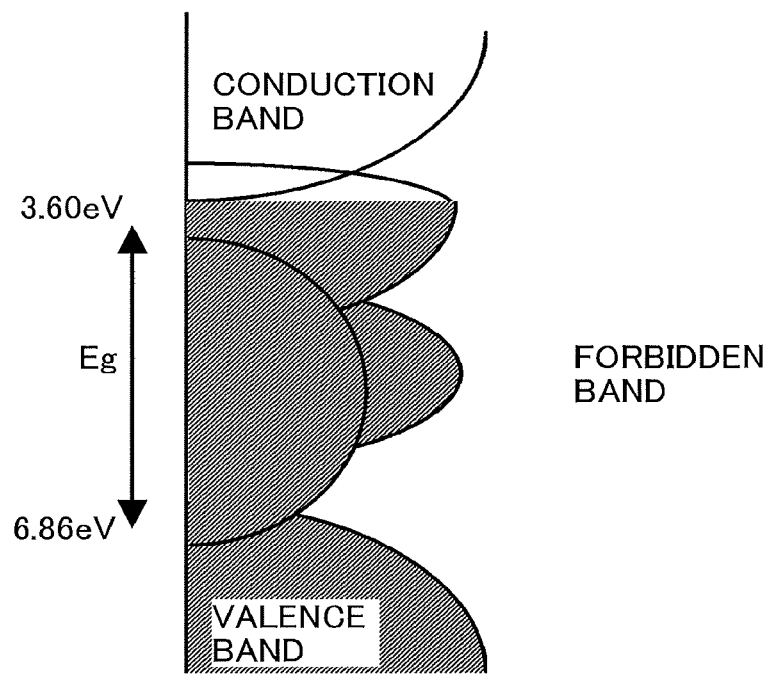
FIG. 11 is a diagram illustrating the function of the first embodiment.

FIG. 11 is a diagram illustrating the function of this embodiment. FIG. 11 illustrates an energy level density and an energy level filling state with an electron when silicon is introduced together with nickel into SiC. The region indicated by hatching in FIG. 11 illustrates a state where the energy levels are filled with electrons.

According to the first principle calculation, new levels are further formed in the forbidden band of SiC by introducing silicon as illustrated in FIG. 11. The newly formed level is formed so as to fill a portion between the energy level formed by introducing nickel and a valence band. Therefore, the resistance of the metal SiC is further reduced.

In addition, nickel enters the carbon site more easily than the silicon site of SiC by co-doping nickel and silicon due to a site competition effect. Therefore, the metallization of SiC is promoted.

In addition, the metal SiC becomes stable up to high temperature of about 1800° C. since nickel easily enters the carbon site. Therefore, it is possible to realize the activation of the p-type impurities in the p-type body region 26 and the p+-type body contact region 32 and the activation of the n-type impurities in the n+-type semiconductor source region 28, and the annealing for metallization of the metal impurity region 29 into which nickel has been injected by the same high-temperature annealing (step S116).

An ion implantation dose of silicon is preferably five times or more, and more preferably ten times or more of an ion implantation dose of nickel from the viewpoint of making nickel enter the carbon site more easily than the silicon site of SiC.

Although the description has been given by exemplifying nickel (Ni) as the element that metallizes SiC, it has been confirmed by the first principle calculation that the same function can be obtained with palladium (Pd) and platinum (Pt).

It is conceivable to reduce a parasitic resistance of a source region by applying a material having a low resistivity to the source region in order to reduce the on-resistance of the MOSFET.

When reducing the resistance of the source region, for example, there is a case where metal silicide having a low resistivity is formed by deposition of a metal film to be silicided, such as nickel, on SiC and heat treatment. In this case, carbon clusters are precipitated at an interface between the source region and SiC. Such carbon clusters may cause an increase in interfacial resistance between the metallized source region and SiC and peeling of a film in the source region.

In this embodiment, the metal source region 30 which is metallized SiC is applied to a part of the source region of the vertical MOSFET as illustrated in FIG. 1.

As a part of the source region is metal, the own resistance of the source region is reduced, and the parasitic resistance of the MOSFET 100 is reduced.

Further, the work function of the metallized SiC is approximately equal to 3.60 eV, which is a potential energy measured from a vacuum level at a conduction band minimum of SiC as described above. Therefore, a work function of the metal source region 30 and the potential energy measured from the vacuum level at the conduction band minimum of the semiconductor source region 28 are substantially equal.

For this reason, an energy barrier height between the metal source region 30 and the semiconductor source region 28 disappears or becomes extremely small. Accordingly, the interfacial resistance between the metal source region 30 and the semiconductor source region 28 also decreases. From this point as well, the MOSFET 100 having the low on-resistance is realized.

In addition, the metallized SiC is excellent in oxidation resistance. Since the carbon defects are filled with nickel (Ni), silicon (Si), or the like, a fact that there is no room for oxygen to enter also becomes one factor that enables the excellence in oxidation resistance. In addition, the film peeling caused by oxygen entrained in a chamber or the like does not occur, and an increase in contact resistance at the interface or the like is avoided. Therefore, the reliability of the MOSFET 100 is also improved.

Further, a boundary between the metal source region 30 and the semiconductor source region 28, made of the same SiC, becomes a continuous interface, and no carbon cluster is formed. Therefore, it is possible to avoid the problems of an increase in resistance at the interface and the film peeling caused by the formation of carbon clusters.

An atomic concentration of metal impurities in the metal source region 30 is preferably $1 \times 10^{19}$ cm$^{-3}$ to $5 \times 10^{22}$ cm$^{-3}$ and more preferably $5 \times 10^{19}$ cm$^{-3}$ to $5 \times 10^{21}$ cm$^{-3}$, for example. When falling below the above range, there is a risk that the metal source region 30 is not sufficiently metallized. In addition, when exceeding the above range, there is a risk that distortion of SiC becomes large and device characteristics are degraded.

From the viewpoint of reducing the parasitic resistance and reducing the on-resistance of the MOSFET, the sheet resistance of the metal source region 30 is preferably 0.5Ω/□ or less. The sheet resistance of the metal source region 30 is more preferably 0.1Ω/□ or less, and even more preferably 0.05Ω/□ or less.

From the viewpoint of reducing the barrier height between the metal source region 30 and the semiconductor source region 28 and reducing the on-resistance of the MOSFET, the work function of the metal source region 30 is preferably 3.7 eV (electron volt) or less. The work function of the metal source region 30 is more preferably 3.6 eV (electron volt) or less.

In the case of a MOSFET in which a source region is formed of an n-type semiconductor, it is difficult to form a low-resistance simultaneous contact in the source region of an n-type SiC semiconductor and a body contact region of a p-type SiC semiconductor using a single kind of metal material. This is because a band gap of SiC is wide.

In this embodiment, since the metal source region 30 is made of metal, it is easy to form the low-resistance simultaneous contact if a metal material forming the low-resistance contact with the body contact region 32 of the p-type semiconductor is selected as a metal material of the source electrode 12 without considering the contact with the metal source region 30. In addition, the simultaneous contact can be realized with the single kind of metal material, and thus, manufacturing cost is reduced.

As described above, it is possible to reduce the on-resistance and to realize the MOSFET with the low loss by forming a part of the source region with SiC of the metal according to the semiconductor device and the method for manufacturing the same of this embodiment. In addition, the simultaneous contact of the source electrode is easily realized, and the manufacturing cost is reduced. In addition, the film peeling of the metal in the source region is suppressed, and the MOSFET with excellent reliability is realized.

Second Embodiment

A method for manufacturing a semiconductor device of this embodiment is different from that of the first embodiment in terms that a p-type impurity, the above-described at least one element, and carbon (C) are ion-implanted into a silicon carbide layer to form a p-type fourth silicon carbide region prior to heat treatment, that is, that the above-described at least one element and carbon (C) are additionally ion-implanted at the time of forming the p-type fourth silicon carbide region. Hereinafter, some of the content overlapping with that in the first embodiment will not be described.

Figure 12:
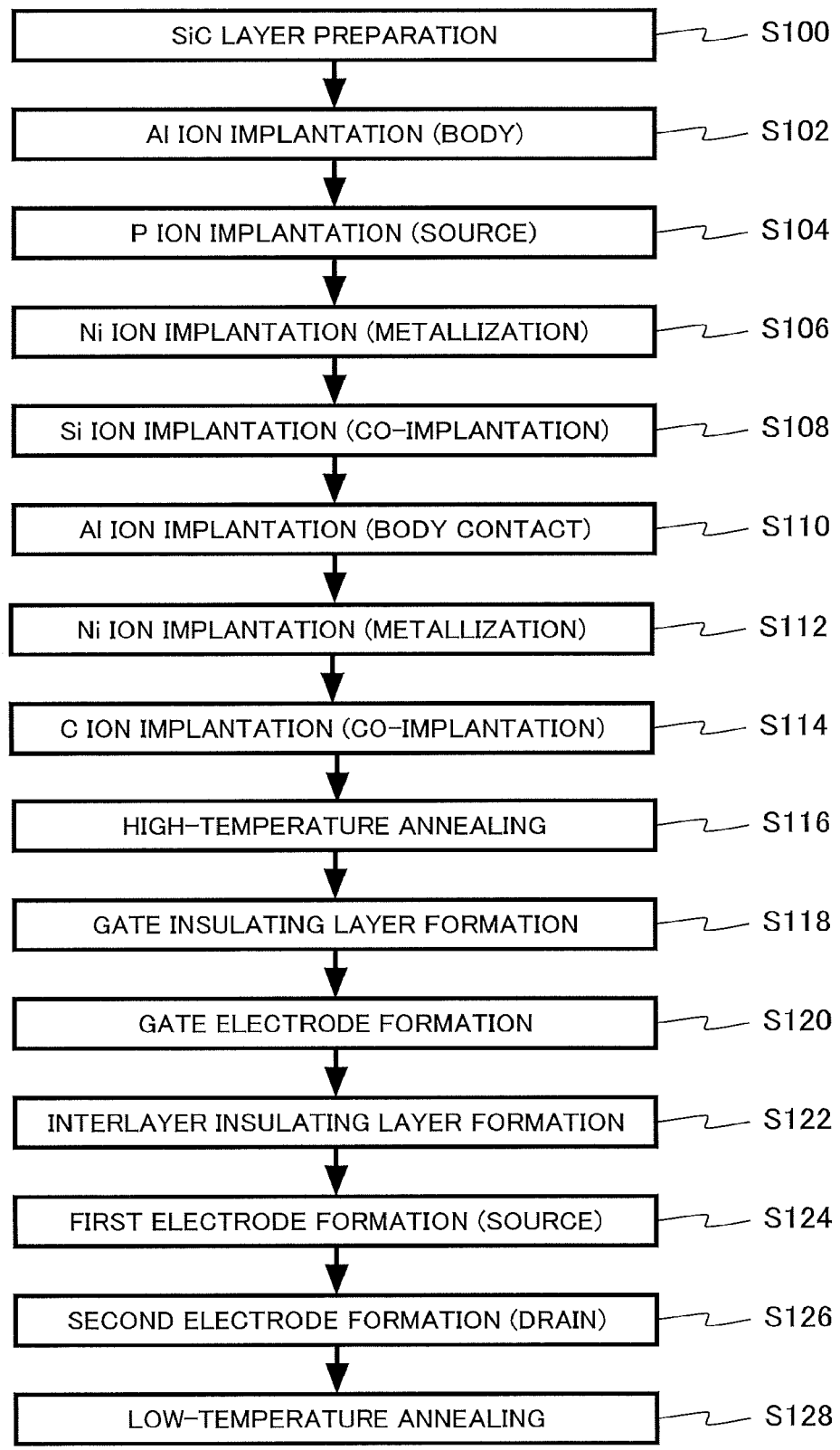
FIG. 12 is a flowchart of a process exemplifying a method for manufacturing a semiconductor device of a second embodiment.
Figure 13:
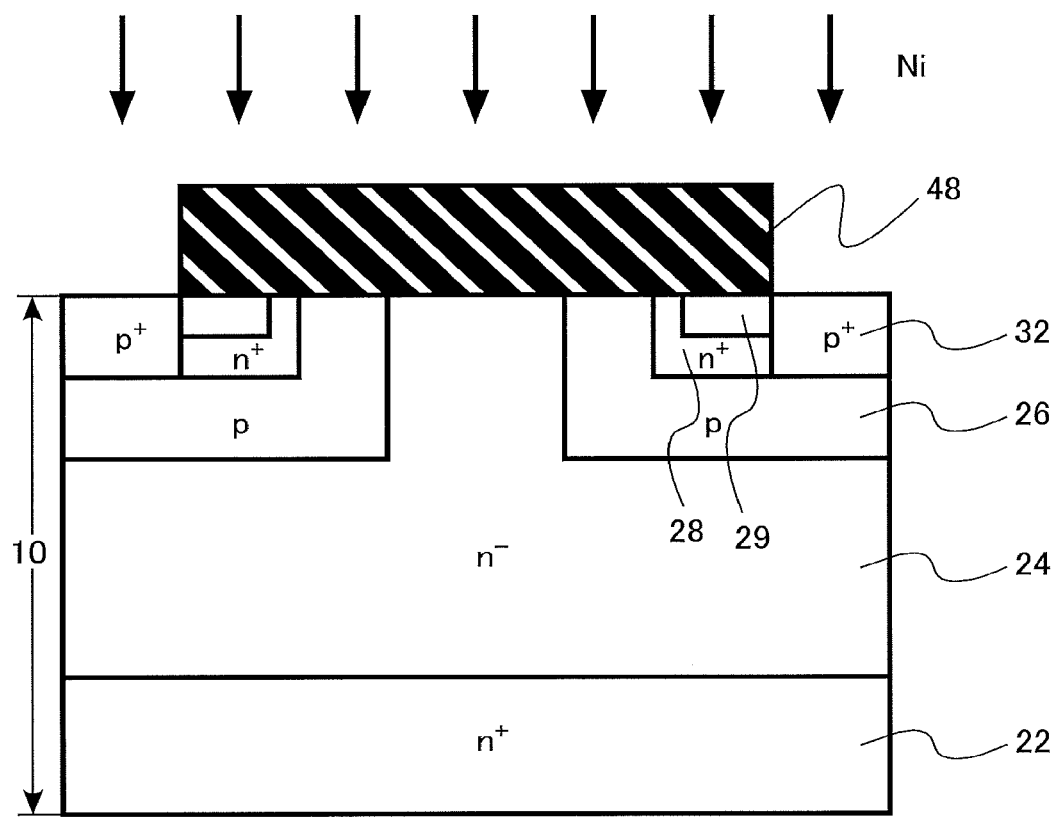
FIG. 13 is a schematic cross-sectional view illustrating the semiconductor device in the middle of being manufactured in the method for manufacturing the semiconductor device of the second embodiment.
Figure 14:
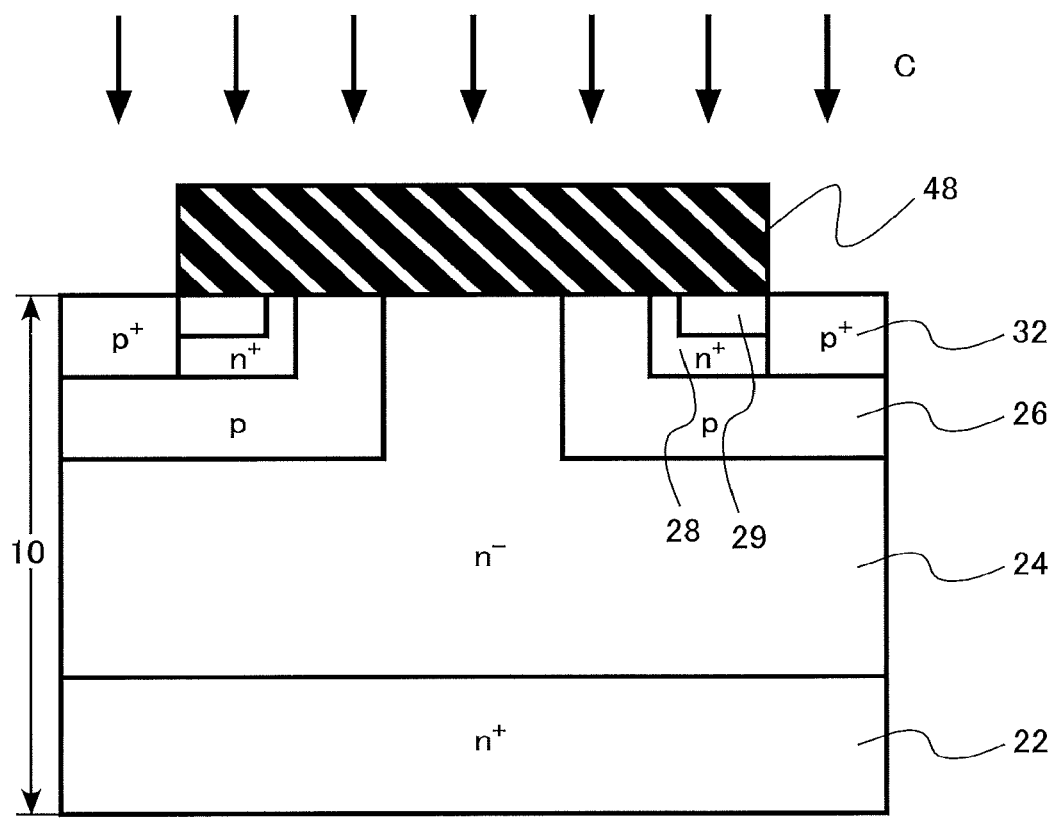
FIG. 14 is a schematic cross-sectional view illustrating the semiconductor device in the middle of being manufactured in the method for manufacturing the semiconductor device of the second embodiment.

FIG. 12 is a flowchart of a process exemplifying the method for manufacturing the semiconductor device of this embodiment. FIGS. 13 and 14 are schematic cross-sectional views illustrating the semiconductor device in the middle of being manufactured in the method for manufacturing the semiconductor device of this embodiment.

Hereinafter, a case where the at least one element is nickel (Ni) will be described as an example.

As illustrated in FIG. 12, the method for manufacturing the semiconductor device includes: the silicon carbide layer (SiC layer) preparation (step S100); the ion implantation of Al (step S102); the ion implantation of P (step S104); the ion implantation of Ni (step S106); the ion implantation of Si (step S108); the ion implantation of Al (step S110); ion implantation of Ni (step S112); ion implantation of C (step S114); the high-temperature annealing (step S116); the gate insulating layer formation (step S118); the gate electrode formation (step S120); the interlayer insulating layer formation (step S122); the first electrode formation (step S124); the second electrode formation (step S126); and the low-temperature annealing (step S128).

The method for manufacturing the semiconductor device of the second embodiment is the same as the method for manufacturing the semiconductor device of the first embodiment except that two steps of the ion implantation of Ni (step S112) and the ion implantation of C (step S114) are provided after the ion implantation of Al (step S110) and before the high-temperature annealing (step S116).

After the ion implantation of Al (step S110) and after aluminum (Al) as p-type impurities is ion-implanted into the body region 26, nickel (Ni) is ion-implanted using the fourth mask material 48 as an ion implantation mask (FIG. 13).

Next, carbon (C) is ion-implanted using the fourth mask material 48 as an ion implantation mask (FIG. 14). As described above, aluminum (Al), nickel (Ni), and carbon (C) as p-type impurities are ion-implanted into the body region 26 (second silicon carbide region) using the fourth mask material 48 as an ion implantation mask, thereby forming the body contact region 32 (fourth silicon carbide region).

At least the nickel (Ni) and carbon (C) are introduced near a front surface of the body contact region 32. With the high-temperature annealing (step S116), nickel enters the silicon site of SiC.

According to the manufacturing method for this embodiment, it is possible to form a MOSFET in which nickel entering the silicon site of SiC is present at least in the vicinity of the front surface of the body contact region 32. An atomic concentration of nickel is preferably $1 \times 10^{19}$ cm$^{-3}$ to $5 \times 10^{22}$ cm$^{-3}$, and more preferably $5 \times 10^{19}$ cm$^{-3}$ to $5 \times 10^{21}$ cm$^{-3}$, for example.

According to the manufacturing method of this embodiment, a localized state of electrons is formed in the vicinity of the interface between the source electrode 12 and the body contact region 32. The localized state of electrons is formed due to nickel (Ni) entering the silicon site of the crystal structure of SiC.

As the localized state of electrons is formed, the Fermi level is pinned, and the interfacial resistance between the source electrode 12 and the body contact region 32 is reduced. Therefore, the body contact region 32 can be stabilized and fixed to the potential of the source electrode 12. Therefore, a MOSFET whose operation is stabilized is realized. As a result, metal to be used for the source electrode can be freely selected. That is, binding depending on the work function disappears, and an easily usable metal may be used. For example, titanium nitride (TiN), tungsten (W), molybdenum nitride (Mo$_2$N), or the like is frequently used. In addition, it is possible to use metal having excellent workability. In addition, it is also possible to use silicide, such as nickel silicide (for example, NiSi, Ni$_2$Si, or NiSi$_2$) and titanium silicide (for example, TiSi), for the source electrode 12. It is also possible to use polysilicon doped with phosphorus (P) or boron (B).

Incidentally, nickel enters the silicon site more easily than the carbon site of SiC by co-doping nickel and carbon due to the site competition effect.

As described above, according to this embodiment, the MOSFET whose operation is stabilized is realized in addition to the effects of the first embodiment.

Third Embodiment

A semiconductor device of this embodiment is different from the first embodiment in terms of not including the n-type fifth silicon carbide region. Hereinafter, some of the content overlapping with that in the first embodiment will not be described.

Figure 15:
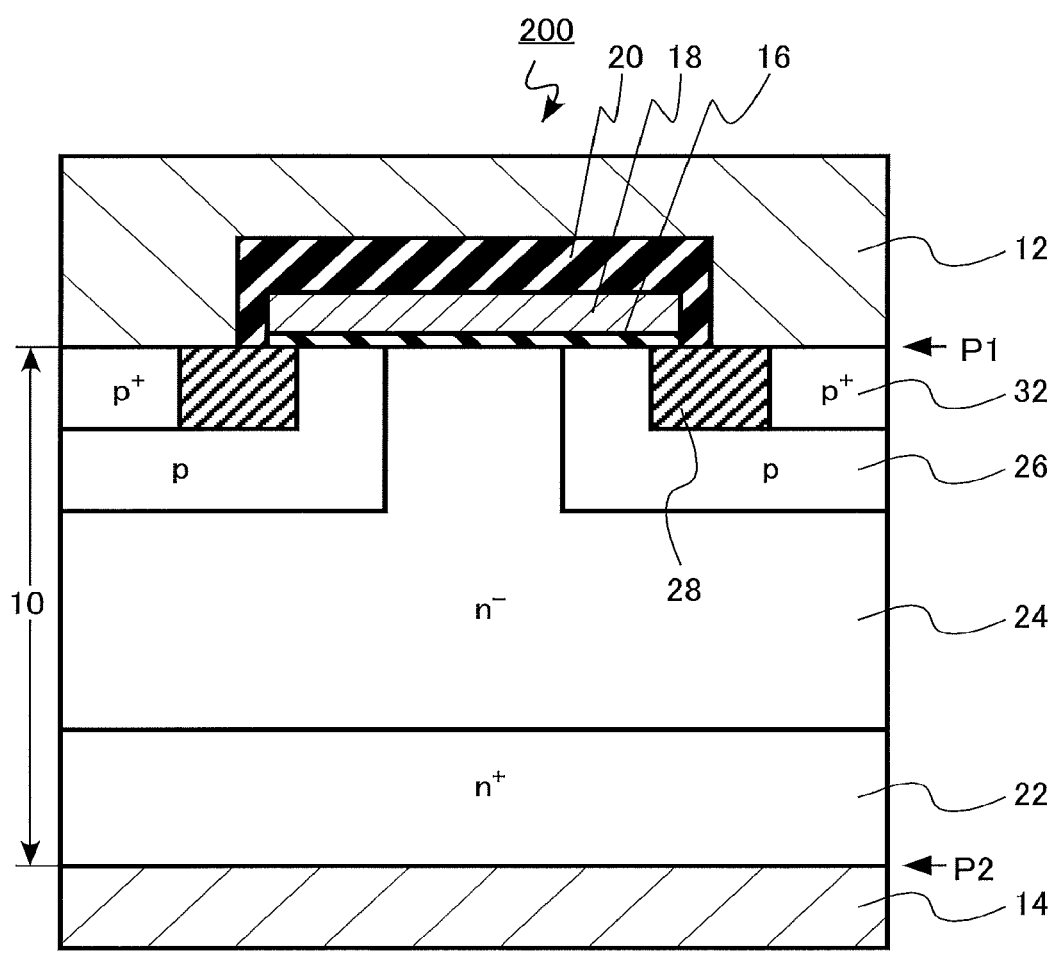
FIG. 15 is a schematic cross-sectional view of a semiconductor device of a third embodiment.

FIG. 15 is a schematic cross-sectional view of the semiconductor device of this embodiment. This semiconductor device is a planar gate vertical MOSFET using silicon carbide.

A MOSFET 200 includes the silicon carbide layer 10, the source electrode (first electrode) 12, the drain electrode (second electrode) 14, the gate insulating layer 16, the gate electrode 18, and the interlayer insulating layer 20.

The n$^+$-type drain region 22 (seventh silicon carbide region), the n$^-$-type drift region 24 (first silicon carbide region), the p-type body region 26 (second silicon carbide region), the metal source region 30 (third silicon carbide region) made of metal, and the p$^+$-type body contact region 32 (fourth silicon carbide region) are provided inside the silicon carbide layer 10.

The metal source region 30 is in direct contact with the p-type body region 26. In the MOSFET 200, the entire source region is formed of metal. The MOSFET 200 is a Schottky source MOSFET.

A depth of the metal source region 30 is, for example, 0.01 µm to 1.0 µm. The metal source region 30 is formed by a combination of ion implantation, electron ion irradiation and metal diffusion, and thus, has the depth of about 1.0 µm or less. In addition, the source metal region remains at the inner side of the p-type body region, and thus, has a depth of 0.5 µm or less. A thickness of the metal source region 30 in a direction toward the drain electrode 14 from the source electrode 12 is, for example, 0.01 µm to 0.5 µm.

In the MOSFET, it is conceivable to metallize the entire source region to reduce a parasitic resistance of the source region. However, SiC has a larger band gap and smaller potential energy measured from the vacuum level at the conduction band minimum as compared with Si. Thus, there is no suitable metal material with a work function to lower the barrier height between the source region and the channel region. Accordingly, it is difficult to reduce an on-resistance by metallizing the entire source region.

In this embodiment, the metallized SiC is applied to the metal source region 30 of the vertical MOSFET as illustrated in FIG. 15.

Figure 16A:
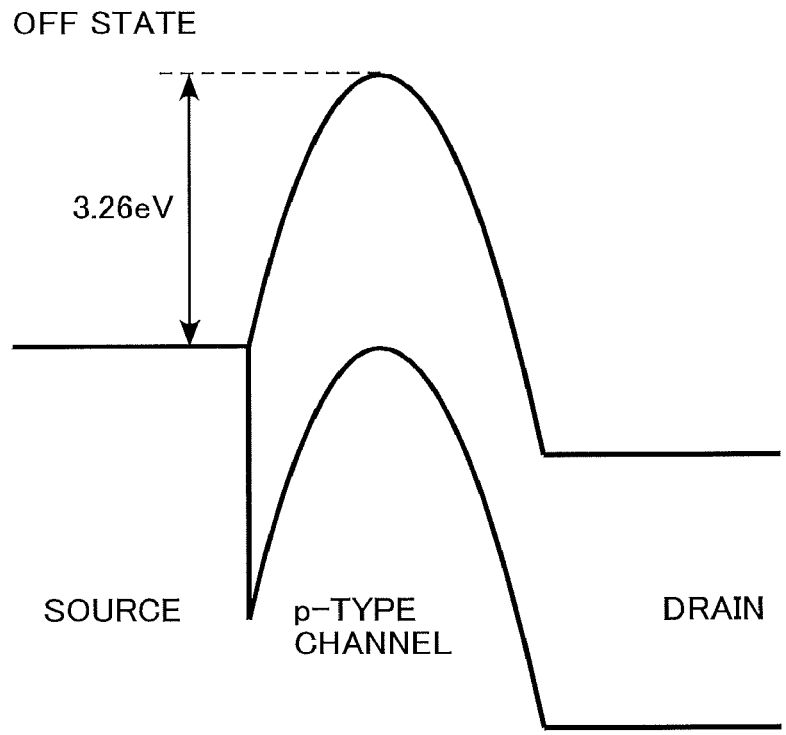
FIGS. 16A and 16B are diagrams illustrating a function of the third embodiment.
Figure 16B:
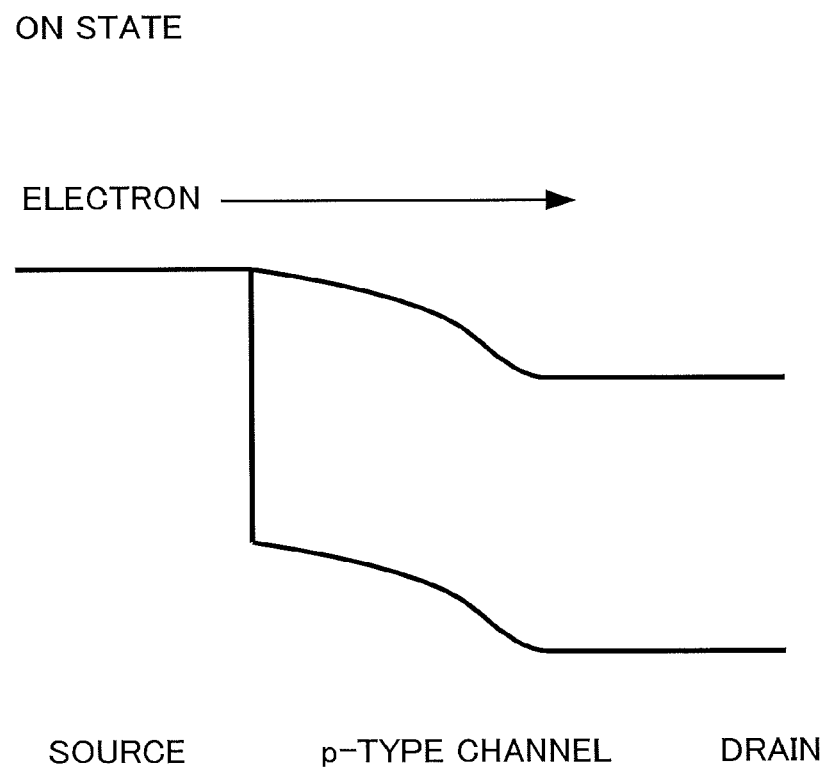

FIGS. 16A and 16B are diagrams illustrating a function of the MOSFET of this embodiment. FIG. 16A is a band diagram between a source and a drain in an off state of the MOSFET. FIG. 16B is a band diagram between the source region and the drain region in an on state of the MOSFET. The drain is an n-type SiC semiconductor.

As described above, a work function of the metallized SiC is approximately equal to 3.60 eV, which is a potential energy measured from a vacuum level at a conduction band minimum of SiC. Therefore, the work function of the source region and the potential energy measured from the vacuum level at the conduction band minimum of a p-type channel region of SiC are substantially equal as illustrated in FIGS. 16A and 16B.

Thus, the energy barrier height of the metal source region 30 and the body region 26 (channel region) disappears or becomes extremely small in the on state of the MOSFET 200 as illustrated in FIG. 16B. Accordingly, the MOSFET 200 having the low on-resistance is realized. Further, a rising angle of current with respect to a gate voltage becomes steep, and thus, it is possible to quickly change the MOSFET 200 from the off state to the on state and to reduce a switching loss.

Further, as the entire source region is made of metal, the own resistance of the source region is further reduced, and the parasitic resistance of the MOSFET 200 is further reduced. Accordingly, the on-resistance is further reduced.

As described above, according to this embodiment, the MOSFET with a lower loss can be realized in addition to the effects of the first embodiment.

Fourth Embodiment

A semiconductor device of this embodiment is different from that of the first embodiment in terms of further including a sixth silicon carbide region of metal containing the above-described at least one element, positioned with the second silicon carbide region interposed between the third and sixth silicon carbide regions and being in contact with the gate insulating layer and the first silicon carbide region. Hereinafter, some of the content overlapping with that in the first embodiment will not be described.

Figure 17:
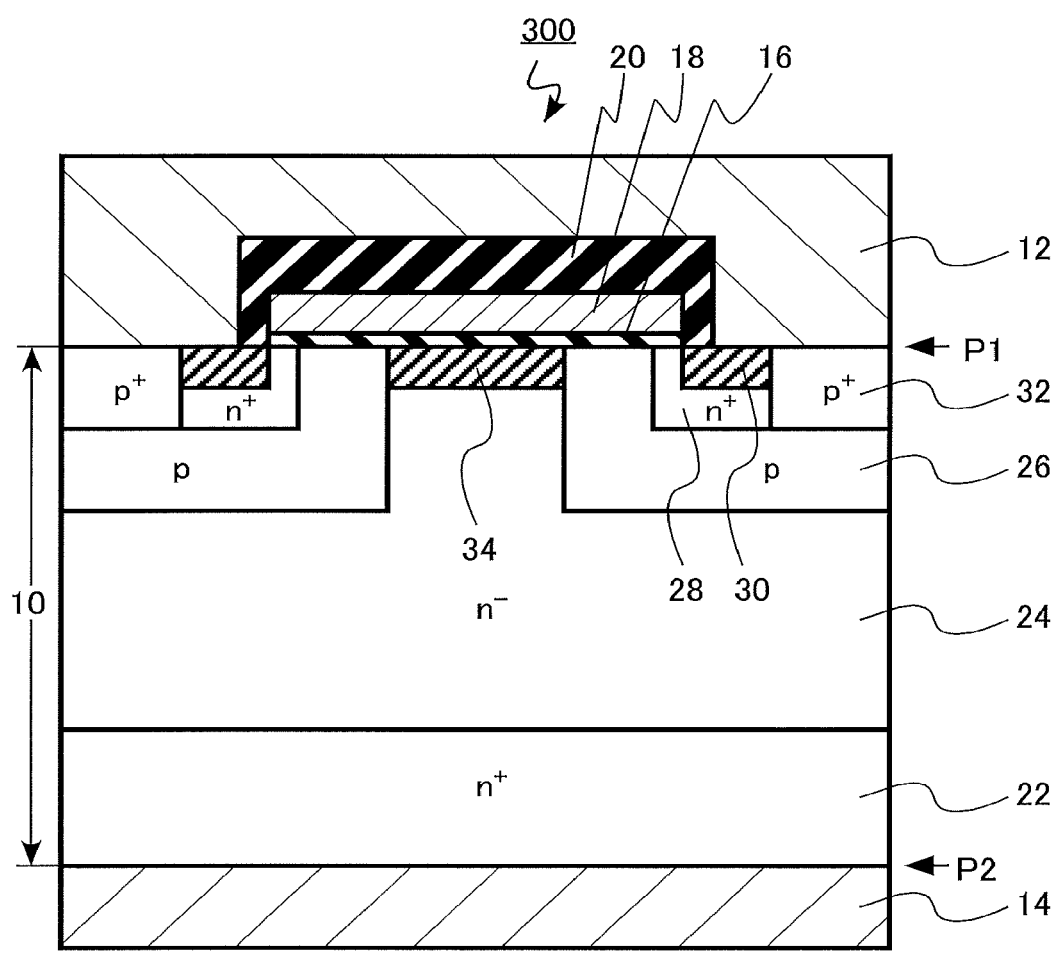
FIG. 17 is a schematic cross-sectional view of a semiconductor device of a fourth embodiment.

FIG. 17 is a schematic cross-sectional view of the semiconductor device of this embodiment. This semiconductor device is a planar gate vertical MOSFET using silicon carbide.

A MOSFET 300 includes a metal region 34 (sixth silicon carbide region). The metal region 34 is provided with the body region 26 interposed between the metal region 34 and the metal source region 30. The metal region 34 is provided with the body region 26 interposed between the metal region 34 and the semiconductor source region 28. The metal region 34 is provided between the gate insulating layer 16 and the drift region 24. The metal region 34 is in contact with the gate insulating layer 16 and the drift region 24.

The metal region 34 is metallized silicon carbide.

The metal region 34 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide.

An atomic concentration of the metal impurities in the metal region 34 is, for example, $1 \times 10^{19}$ cm$^{-3}$ to $5 \times 10^{22}$ cm$^{-3}$.

A depth of the metal region 34 is shallower than that of the semiconductor source region 28, for example. The depth of the metal source region 30 is, for example, 0.01 μm to 0.3 μm. A thickness of the metal region 34 in a direction toward the drain electrode 14 from the source electrode 12 is, for example, 0.01 μm to 0.3 μm.

A sheet resistance of the metal region 34 is, for example, 0.5Ω/□ or less. A work function of the metal region 34 is, for example, 3.7 eV or less.

The metal impurities in the metal region 34 may be the same as or different from the metal impurity in the metal source region 30.

The metal region 34 can be formed simultaneously with the metal source region 30, for example. The metal impurity in the metal region 34 is preferably the same as the metal impurity in the metal source region 30 from the viewpoint of reducing the manufacturing cost of the MOSFET 300.

The drift region 24 on a side where a carrier escapes from a channel is a so-called JFET resistance. However, the JFET resistance decreases if this region becomes a metallized SiC region. As a result, the JFET resistance itself can be reduced.

Although it is well known that the JFET resistance disappears in a MOSFETs having a trench structure, it is possible to realize a DiMOSFET having a low conduction loss equivalent to that of the trench structure by forming a JFET region as the metal region having the small work function as in this embodiment.

As described above, according to this embodiment, the MOSFET with the lower loss can be realized in addition to the effects of the first embodiment.

Fifth Embodiment

A semiconductor device of this embodiment is different from the first embodiment in terms of being a so-called trench MOSFET in which a gate insulating layer and a gate electrode are formed in a trench. Hereinafter, some of the content overlapping with that in the first embodiment will not be described.

Figure 18:
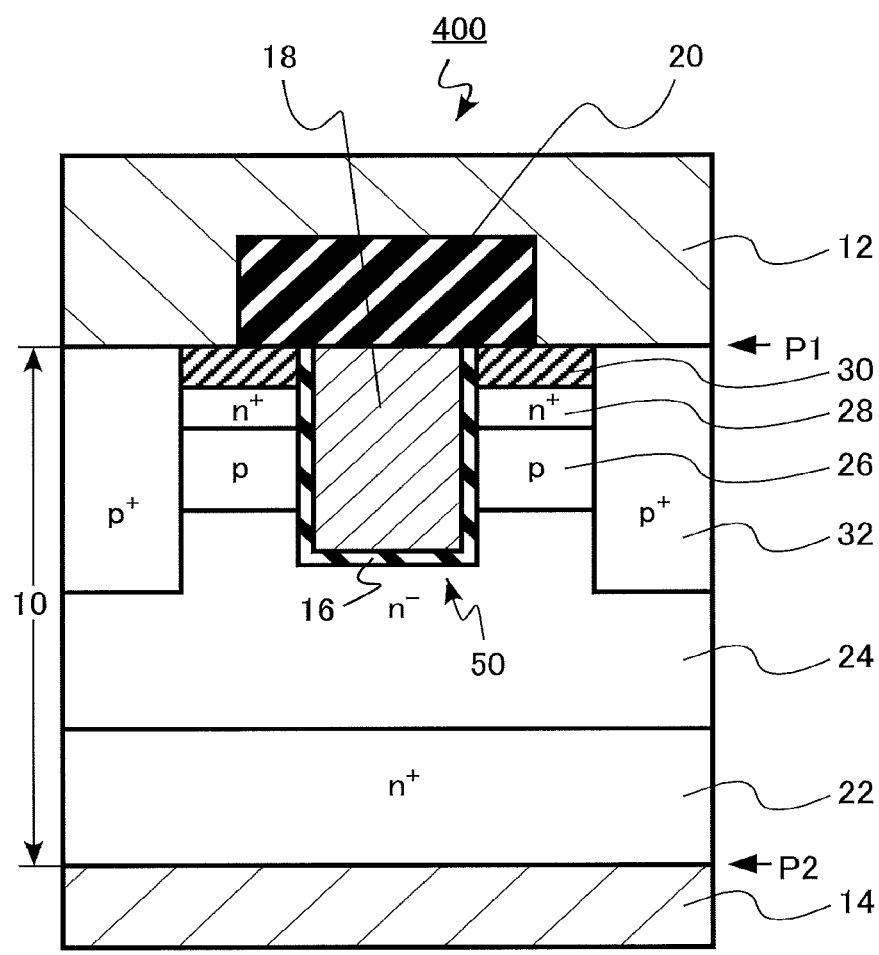
FIG. 18 is a schematic cross-sectional view of a semiconductor device of a fifth embodiment.

FIG. 18 is a schematic cross-sectional view illustrating a configuration of the MOSFET which is the semiconductor device of this embodiment.

A MOSFET 400 includes the silicon carbide layer 10, the source electrode (first electrode) 12, the drain electrode (second electrode) 14, the gate insulating layer 16, the gate electrode 18, and the interlayer insulating layer 20.

The n$^+$-type drain region 22 (seventh silicon carbide region), the n$^-$-type drift region 24 (first silicon carbide region), the p-type body region 26 (second silicon carbide region), the n$^+$-type semiconductor source region 28 (fifth silicon carbide region), the metal source region 30 (third silicon carbide region) made of metal, the p$^+$-type body contact region 32 (fourth silicon carbide region), and a trench 50 are provided inside the silicon carbide layer 10.

As illustrated in FIG. 18, the gate insulating layer 16 and the gate electrode 18 are formed inside the trench 50 provided in the silicon carbide layer 10 in the MOSFET 400 of this embodiment. The gate insulating layer 16 is in contact with the drift region 24, the body region 26, the semiconductor source region 28, and the metal source region 30. In addition, the body contact region 32 can be also made deeper than the body region 26, for example.

As the MOSFET 400 adopts the trench structure, a degree of integration increases and an on-resistance decreases. Further, it is possible to shorten a channel length by utilizing improvement of cutoff characteristics. Therefore, the on-resistance can be further reduced. The channel length of the trench MOSFET can be shortened by reducing the thickness of the body region 26.

As described above, according to this embodiment, the MOSFET with the lower loss can be realized by adopting the trench structure in addition to the effects of the first embodiment.

Sixth Embodiment

A semiconductor device of this embodiment is different from the third embodiment in terms of being a so-called trench MOSFET in which a gate insulating layer and a gate electrode are formed in a trench. In addition, this embodiment is different from the fifth embodiment in terms of not including the semiconductor source region 28 (fifth silicon carbide region). Hereinafter, some of the content overlapping with that in the third and fifth embodiments will not be described.

Figure 19:
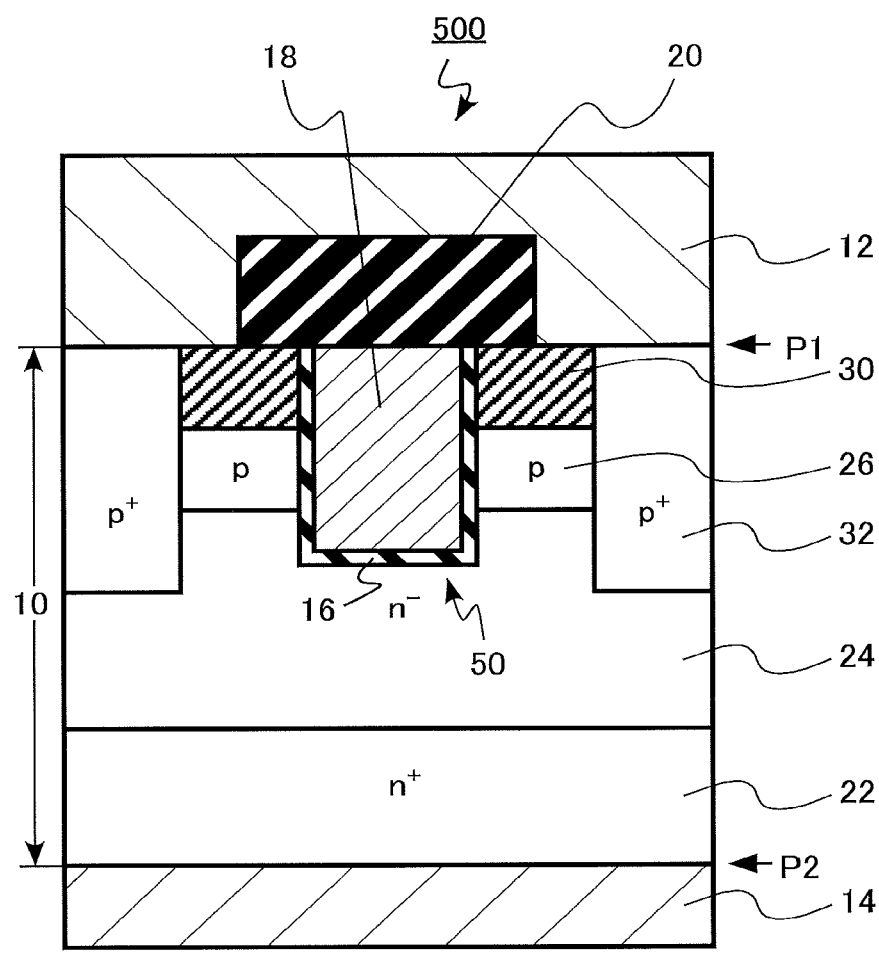
FIG. 19 is a schematic cross-sectional view of a semiconductor device of a sixth embodiment.

FIG. 19 is a schematic cross-sectional view illustrating a configuration of the MOSFET which is the semiconductor device of this embodiment.

As illustrated in FIG. 19, a MOSFET 500 of this embodiment is the trench MOSFET. In addition, the MOSFET 500 is a Schottky source MOSFET.

According to this embodiment, the MOSFET with the lower loss can be realized by adopting the trench structure in addition to the effects of the third embodiment.

Seventh Embodiment

A semiconductor device of this embodiment is different from that of the fifth embodiment in terms of further including the sixth silicon carbide region of metal containing the above-described at least one element, positioned with the second silicon carbide region interposed between the third and sixth silicon carbide regions and being in contact with the gate insulating layer and the first silicon carbide region. Hereinafter, some of the content overlapping with that in the fifth embodiment will not be described.

Figure 20:
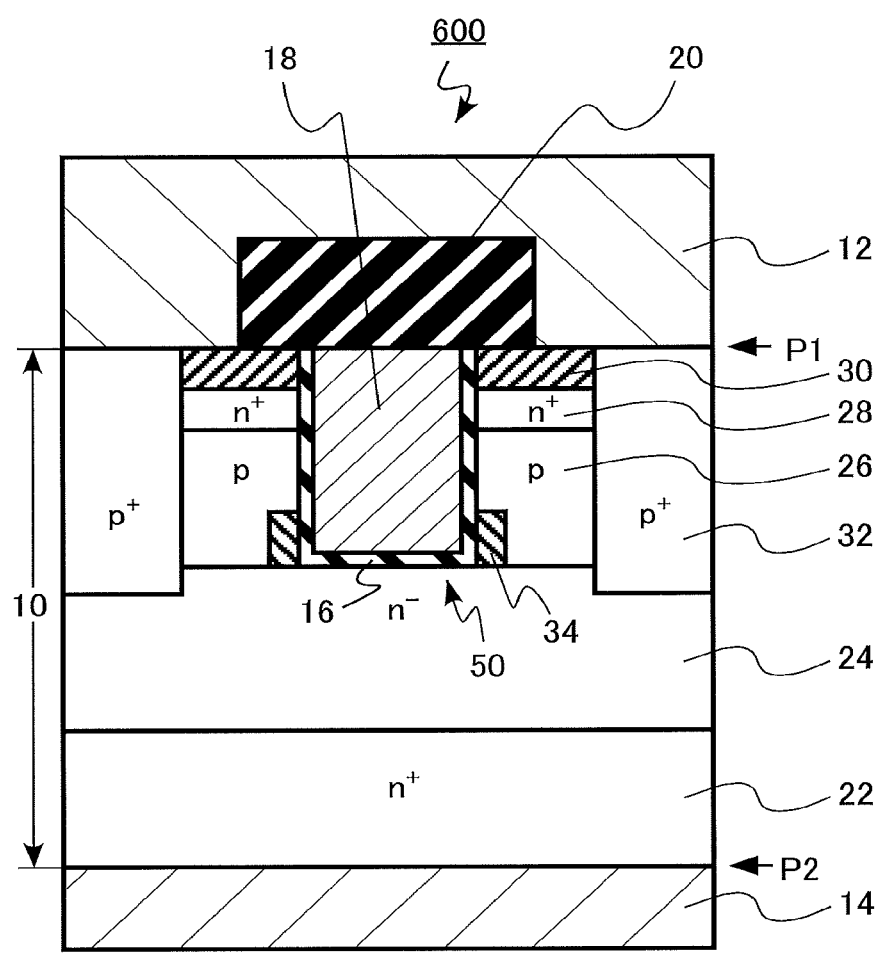
FIG. 20 is a schematic cross-sectional view of a semiconductor device of a seventh embodiment.

FIG. 20 is a schematic cross-sectional view illustrating a configuration of a MOSFET which is the semiconductor device of this embodiment.

A MOSFET 600 includes the metal region 34 (sixth silicon carbide region). The metal region 34 is provided with the body region 26 interposed between the metal region 34 and the metal source region 30. The metal region 34 is provided with the body region 26 interposed between the metal region 34 and the semiconductor source region 28. The metal region 34 is provided between the body region 26 and the drift region 24. The metal region 34 is in contact with the gate insulating layer 16 and the drift region 24.

The metal region 34 is metallized silicon carbide.

The metal region 34 contains at least one element (hereinafter referred to as a metal impurity) selected from the group consisting of nickel (Ni), palladium (Pd), and platinum (Pt). The metal impurities are present at carbon sites of a crystal structure of silicon carbide. In other words, the metal impurities substitute carbon atoms of silicon carbide.

An atomic concentration of the metal impurities in the metal region 34 is, for example, $1 \times 10^{19}$ cm$^{-3}$ to $5 \times 10^{22}$ cm$^{-3}$.

A thickness of the metal region 34 in a direction perpendicular to a side surface of the trench 50 is, for example, 0.01 μm to 0.3 μm.

A sheet resistance of the metal region 34 is, for example, 0.5Ω/□ or less. A work function of the metal region 34 is, for example, 3.7 eV or less.

The metal impurities in the metal region 34 may be the same as or different from the metal impurity in the metal source region 30.

As the metal region 34 is provided, carriers having passed through the body region 26 (channel region) efficiently spread inside the drift region 24. Therefore, the on-resistance of the MOSFET 600 is reduced.

As described above, according to this embodiment, the MOSFET with a lower loss can be realized in addition to the effects of the fifth embodiment.

Eighth Embodiment

A semiconductor device of this embodiment is different from that of the seventh embodiment in terms of not including the third silicon carbide region. Hereinafter, some of the content overlapping with that in the seventh embodiment will not be described.

Figure 21:
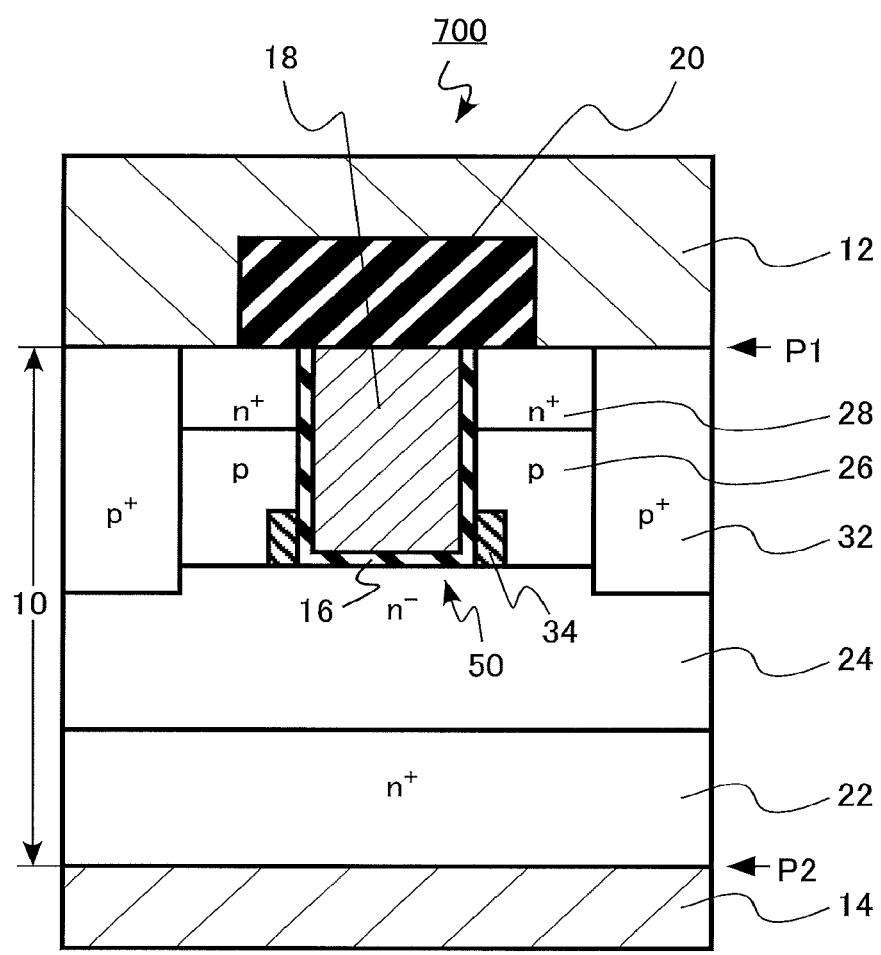
FIG. 21 is a schematic cross-sectional view of a semiconductor device of an eighth embodiment.

FIG. 21 is a schematic cross-sectional view illustrating a configuration of a MOSFET which is the semiconductor device of this embodiment.

A MOSFET 700 includes the metal region 34. The MOSFET 700 does not include the metal source region 30, which is different from the MOSFET 600 of the seventh embodiment.

According to this embodiment, the low-loss MOSFET can be realized by providing the metal region 34.

Ninth Embodiment

An inverter circuit and a driving device of this embodiment correspond to a driving device including the semiconductor device of the first embodiment.

Figure 22:
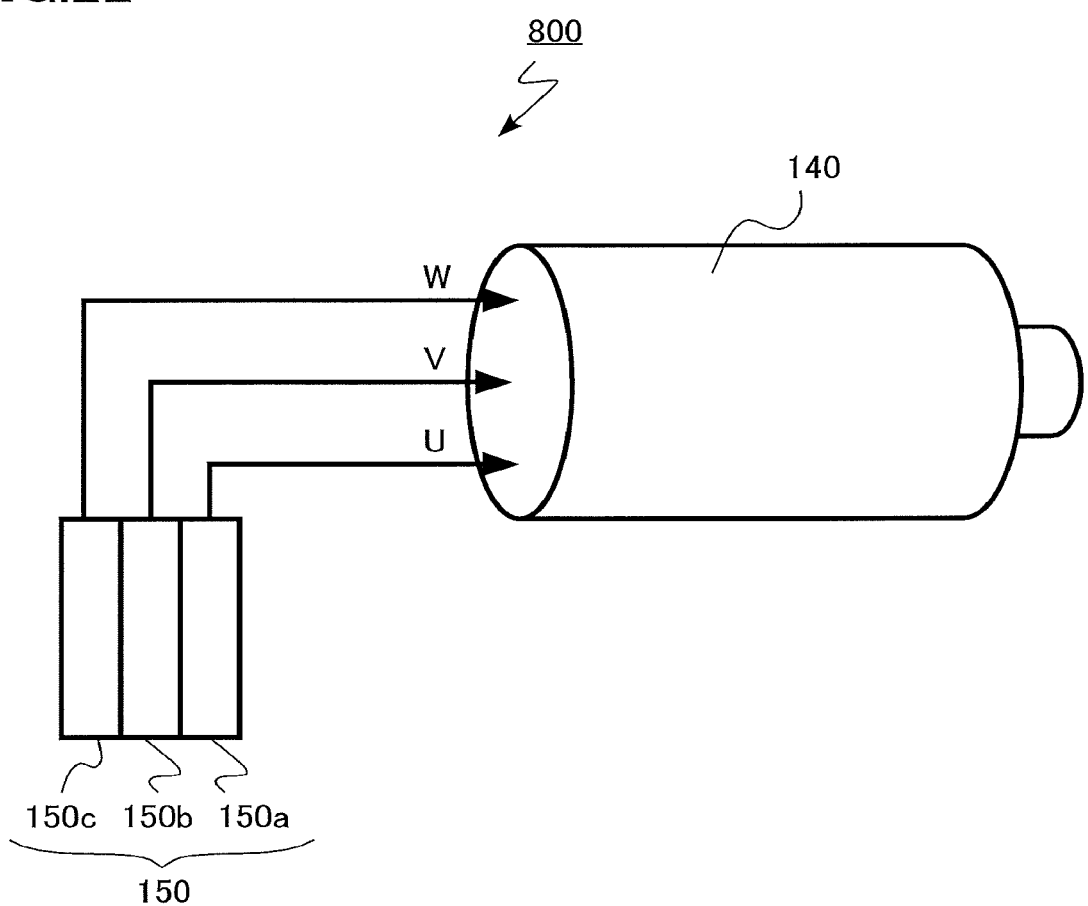
FIG. 22 is a schematic diagram of a driving device of a ninth embodiment.

FIG. 22 is a schematic diagram of the driving device of this embodiment. A driving device 800 includes a motor 140 and an inverter circuit 150.

The inverter circuit 150 includes three semiconductor modules 150*a*, 150*b*, and 150*c* using the MOSFET 100 of the first embodiment as a switching element. The three-phase inverter circuit 150 having three AC voltage output terminals U, V, and W is realized by connecting the three semiconductor modules 150*a*, 150*b*, and 150*c* in parallel. The motor 140 is driven by the AC voltage output from the inverter circuit 150.

According to this embodiment, characteristics of the inverter circuit 150 and the driving device 800 are improved by providing the MOSFET 100 with improved characteristics.

Tenth Embodiment

A vehicle of this embodiment is a vehicle including the semiconductor device of the first embodiment.

Figure 23:
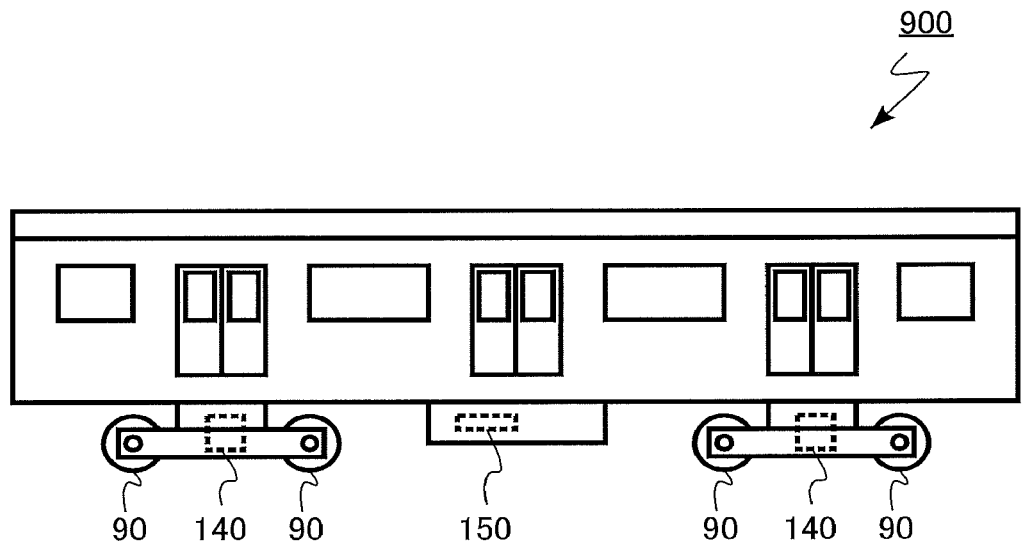
FIG. 23 is a schematic diagram of a vehicle of a tenth embodiment.

FIG. 23 is a schematic diagram of the vehicle of this embodiment. A vehicle 900 of this embodiment is a railway vehicle. The vehicle 900 includes the motor 140 and the inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel. The motor 140 is driven by the AC voltage output from the inverter circuit 150. Wheels 90 of the vehicle 900 are rotated by the motor 140.

According to this embodiment, characteristics of the vehicle 900 are improved by providing the MOSFET 100 with improved characteristics.

Eleventh Embodiment

A vehicle of this embodiment is a vehicle including the semiconductor device of the first embodiment.

Figure 24:
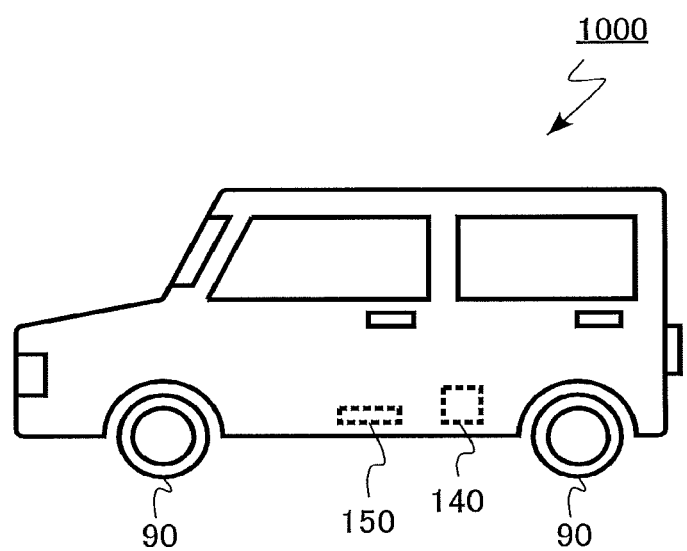
FIG. 24 is a schematic diagram of a vehicle of an eleventh embodiment.

FIG. 24 is a schematic diagram of the vehicle of this embodiment. A vehicle 1000 according to this embodiment is a car. The vehicle 1000 includes the motor 140 and the inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The wheels 90 of the vehicle 1000 are rotated by the motor 140.

According to this embodiment, characteristics of the vehicle 1000 are improved by providing the MOSFET 100 with improved characteristics.

Twelfth Embodiment

An elevator of this embodiment is an elevator including the semiconductor device of the first embodiment.

Figure 25:
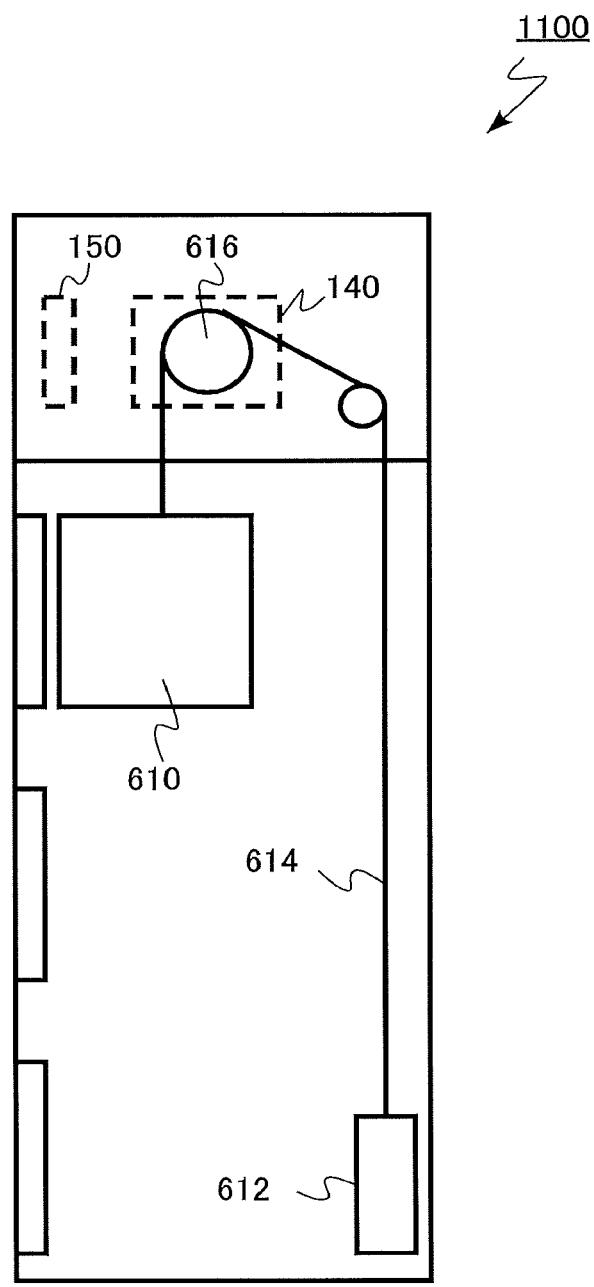
FIG. 25 is a schematic diagram of an elevator of a twelfth embodiment.

FIG. 25 is a schematic diagram of the elevator of this embodiment. An elevator 1100 of this embodiment includes an elevator car 610, a counterweight 612, a wire rope 614, a hoisting machine 616, a motor 140, and the inverter circuit 150.

The inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The hoisting machine 616 is rotated by the motor 140 to move the elevator car 610 up and down.

According to this embodiment, characteristics of the elevator 1100 are improved by providing the MOSFET 100 with improved characteristics.

As described above, the description has been given in the embodiments by exemplifying the case of 4H—SiC as the crystal structure of silicon carbide, but the present disclosure can also be applied to silicon carbide having other crystal structures such as 6H—SiC and 3C—SiC.

In addition, the description has been given in the embodiments by exemplifying the case where the gate insulating layer 16 is provided on the silicon face of silicon carbide, but the present disclosure can also be applied to a case where the gate insulating layer 16 is provided on another face, for example, a carbon face, an a face, an m face, a (0-33-8) face, or the like of silicon carbide.

In addition, the present disclosure can also be applied to an n-channel IGBT. It is possible to realize an IGBT by replacing a region corresponding to the drain region 22 (seventh silicon carbide region) of the MOSFET of the embodiments from the n-type to the p-type.

In addition, the body contact region 32 is formed by ion implantation or the like in the MOSFET having the trench structure of the fifth to eighth embodiments. Instead of this structure, it is also possible to form a so-called double trench structure in which the body contact region 32 is formed using a trench structure. For example, the trench structure is also formed in the source electrode 12 part to bury the source electrode 12. Then, the body contact region 32 is formed by ion implantation, and the source electrode 12 is buried in the trench structure. The double trench structure makes it easier to form the deep body contact region 32, so that a high electric field is prevented from being applied to the gate insulating layer 16 of a gate trench, and a breakdown voltage structure has higher performance. This is because breakdown voltage characteristics are improved as a distance between the gate trench and the body contact region 32 in the lateral direction decreases and the distance in the longitudinal direction increases.

In addition, the description has been given in the tenth to twelfth embodiments by exemplifying the case where the semiconductor device of the present disclosure is applied to a vehicle or an elevator, but the semiconductor device of the present disclosure can also be applied to, for example, a power conditioner of a photovoltaic power generation system or the like.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a gate electrode;
   an n-type first silicon carbide region positioned between the first electrode and the second electrode and between the gate electrode and the second electrode;
   a p-type second silicon carbide region positioned between the first electrode and the first silicon carbide region;
   a third silicon carbide region positioned between the first electrode and the p-type second silicon carbide region and spaced apart from the n-type first silicon carbide region, the third silicon carbide region being metallized silicon carbide containing at least one element selected from the group consisting of nickel (Ni), palladium (Pd), and platinum (Pt), and the third silicon carbide region having a crystal structure of silicon carbide; and
   a gate insulating layer positioned between the gate electrode and the p-type second silicon carbide region, wherein
   the at least one element is present at the carbon site of the crystal structure of silicon carbide, and
   a concentration of the at least one element in the third silicon carbide region is $1 \times 10^{19}$ cm$^{-3}$ to $5 \times 10^{22}$ cm$^{-3}$.

2. The semiconductor device according to claim 1, wherein the third silicon carbide region contains silicon (Si) present at a carbon site of a crystal structure of silicon carbide.

3. The semiconductor device according to claim 1, wherein a thickness of the third silicon carbide region in a direction toward the second electrode from the first electrode is 0.01 μm to 0.5 μm.

4. The semiconductor device according to claim 1, wherein a sheet resistance of the third silicon carbide region is 0.5Ω/□ or less.

5. The semiconductor device according to claim 1, wherein a work function of the third silicon carbide region is 3.7 eV or less.

6. The semiconductor device according to claim 1, further comprising a p-type fourth silicon carbide region positioned between the p-type second silicon carbide region and the first electrode and having a higher p-type impurity concentration than that of the p-type second silicon carbide region.

7. The semiconductor device according to claim 1, further comprising an n-type fifth silicon carbide region between the p-type second silicon carbide region and the third silicon carbide region.

8. The semiconductor device according to claim 1, further comprising a sixth silicon carbide region of metal containing the at least one element, the p-type second silicon carbide region interposed between the third silicon carbide region and the sixth silicon carbide region, and the sixth silicon carbide region being in contact with the gate insulating layer and the n-type first silicon carbide region.

9. The semiconductor device according to claim 1, further comprising an n-type seventh silicon carbide region positioned between the n-type first silicon carbide region and the second electrode and having a higher n-type impurity concentration than that of the n-type first silicon carbide region.

10. An inverter circuit comprising the semiconductor device according to claim 1.

11. A driving device comprising the semiconductor device according to claim 1.

12. A vehicle comprising the semiconductor device according to claim 1.

13. An elevator comprising the semiconductor device according to claim 1.

\* \* \* \* \*